United States Patent [19]

Mendelson

[11] Patent Number: 5,539,412
[45] Date of Patent: Jul. 23, 1996

[54] RADAR SYSTEM WITH ADAPTIVE CLUTTER SUPPRESSION

[75] Inventor: Howard B. Mendelson, Columbia, Md.

[73] Assignee: Litton Systems, Inc., Woodland Hills, Calif.

[21] Appl. No.: 235,391

[22] Filed: Apr. 29, 1994

[51] Int. Cl.[6] .......................... G01S 13/00; G01R 23/16
[52] U.S. Cl. ...................................... 342/192; 324/76.19
[58] Field of Search ............................. 342/159, 93, 192, 342/193; 324/76.19, 76.21

[56] References Cited

U.S. PATENT DOCUMENTS

| | | | |
|---|---|---|---|
| 3,775,768 | 11/1973 | Lisle et al. | 342/159 |
| 3,877,010 | 4/1975 | Holberg et al. | 342/159 |
| 3,995,271 | 11/1976 | Goggins, Jr. | 342/159 |
| 4,064,511 | 12/1977 | Manfanovsky | 342/159 |
| 4,290,066 | 9/1981 | Butler | 342/159 |
| 4,542,381 | 9/1985 | Wilhelm | 342/93 |

OTHER PUBLICATIONS

Adams, J. W., "A New Optimal Window", IEEE Trans. On Signal Processing, vol. 39, No. 8, Aug. 1991, pp. 1753–1769.

*Primary Examiner*—Ian J. Lobo
*Attorney, Agent, or Firm*—Gerald L. Lett

[57] ABSTRACT

A method of spectral estimation of a received radar signal wherein an image of the received radar signal is applied to windows of differing prolate spheroidal sequences to calculate multiple eigenspectra. The value of each of said sequences are multiplied with the radar signal, and the Fourier transforms of the products provide a plurality of realizations of orthogonal eigenspectra. The orthogonal eigenspectra are combined into a minimum variance, low bias estimate of the mean power spectrum and an estimate of a variance of said spectrum for each frequency in the spectrum to provide a more accurate estimate of back ground noise and to further improve detection performance.

1 Claim, 30 Drawing Sheets

- SIGNAL RETURN IN A DOPPLER FILTER IS ESTIMATED USING MAGNITUDE FROM THAT DOPPLER FILTER
- BACKGROUND ESTIMATE IS TYPICALLY FORMED USING THE AVERAGE MAGNITUDE FROM SOME NUMBER OF CELLS CENTERED ABOUT THE CELL OF INTEREST
- LIMITATIONS
  - NO ATTEMPT IS MADE TO "REMOVE" NOISE FROM POSSIBLE TARGET RETURN
  - BACKGROUND ESTIMATE IS NOT OPTIMAL ESTIMATE

RELATIVE FREQUENCY RESPONSE OF TWO PULSE (SOLID) AND
THREE PULSE (DASHED) DELAY LINE CANCELERS

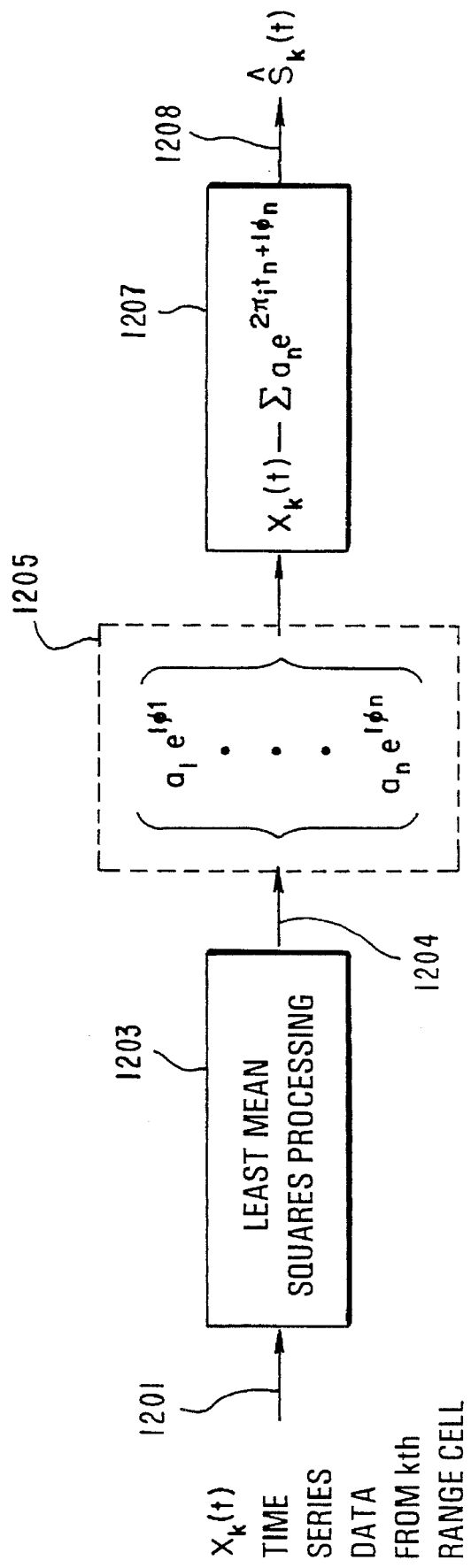

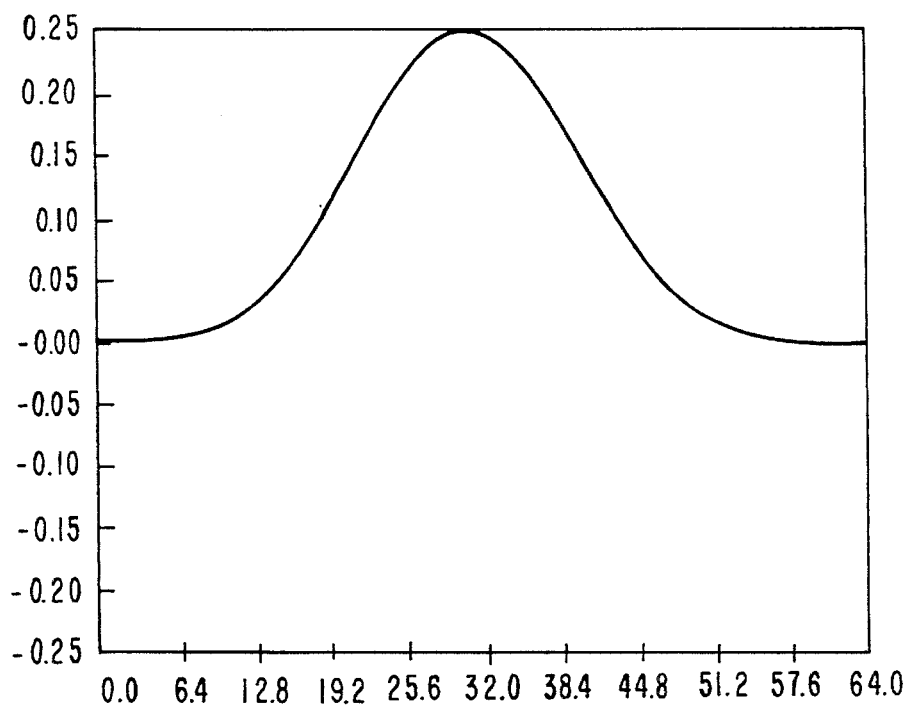
FIG. 16A  SAMPLE NUMBER
K = 0
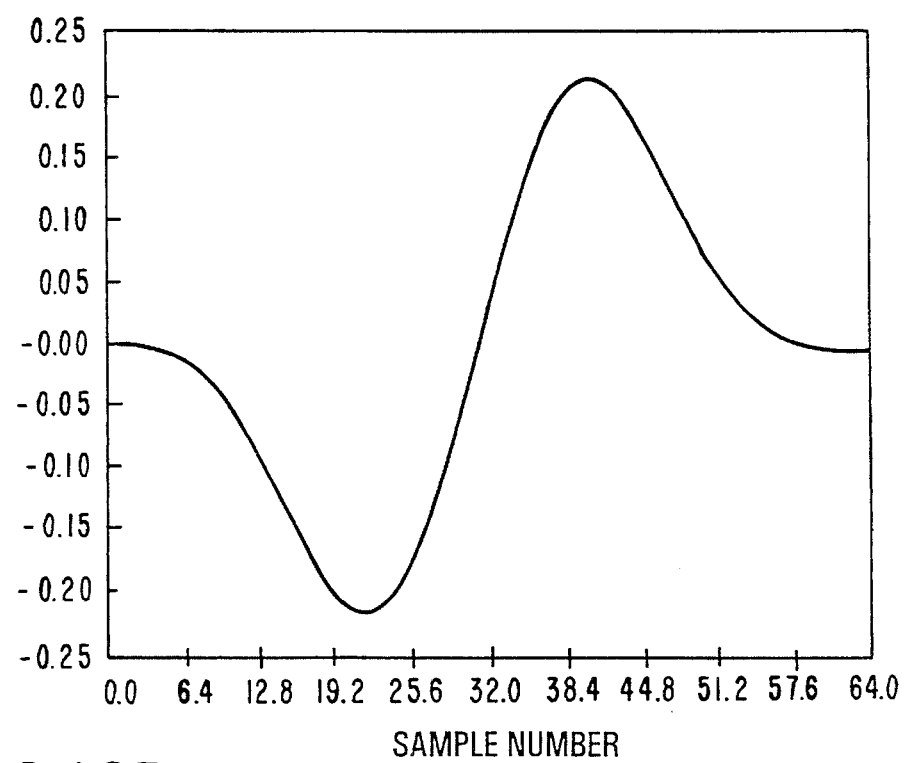
FIG. 16B  SAMPLE NUMBER
K = 1

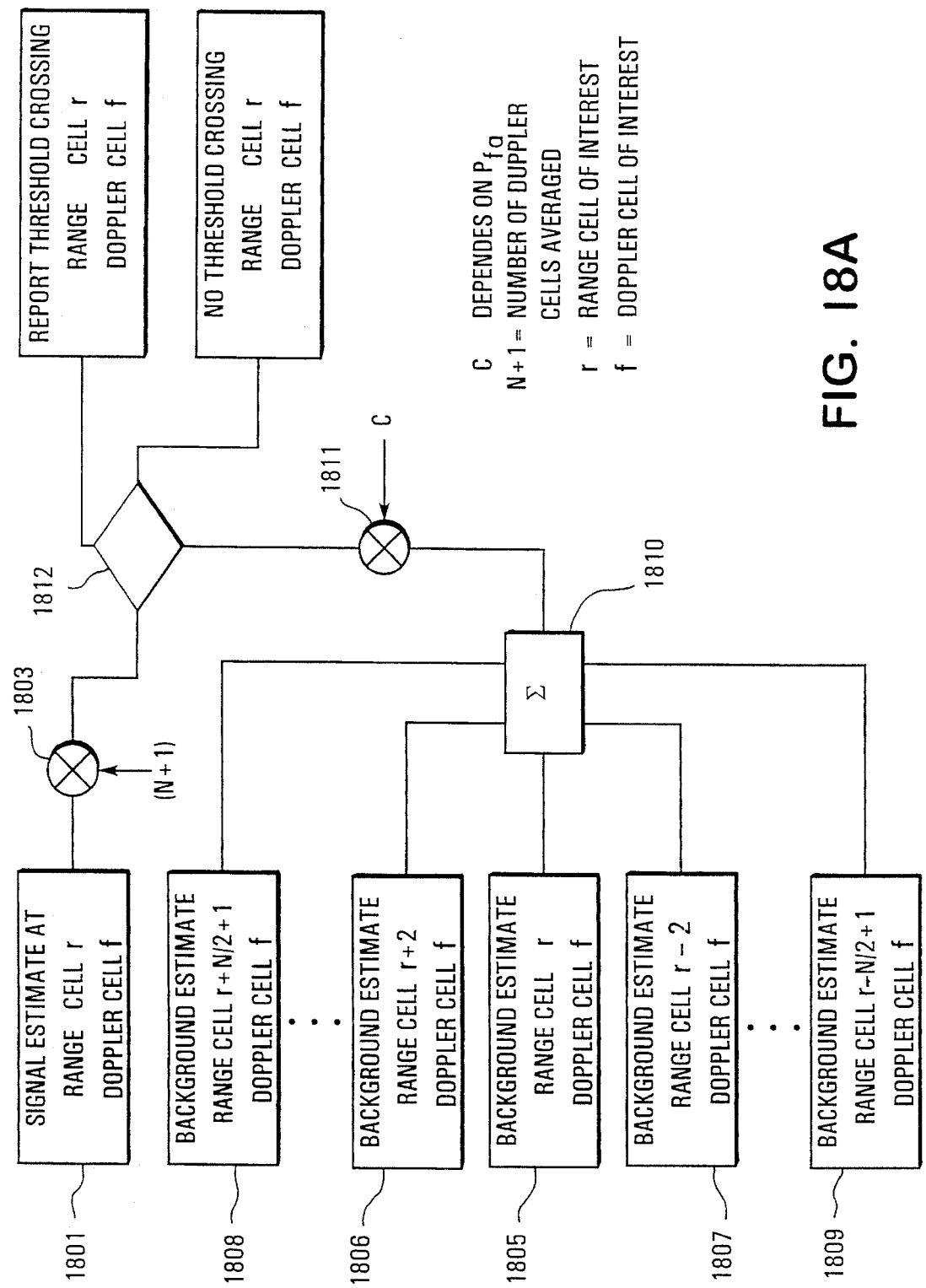

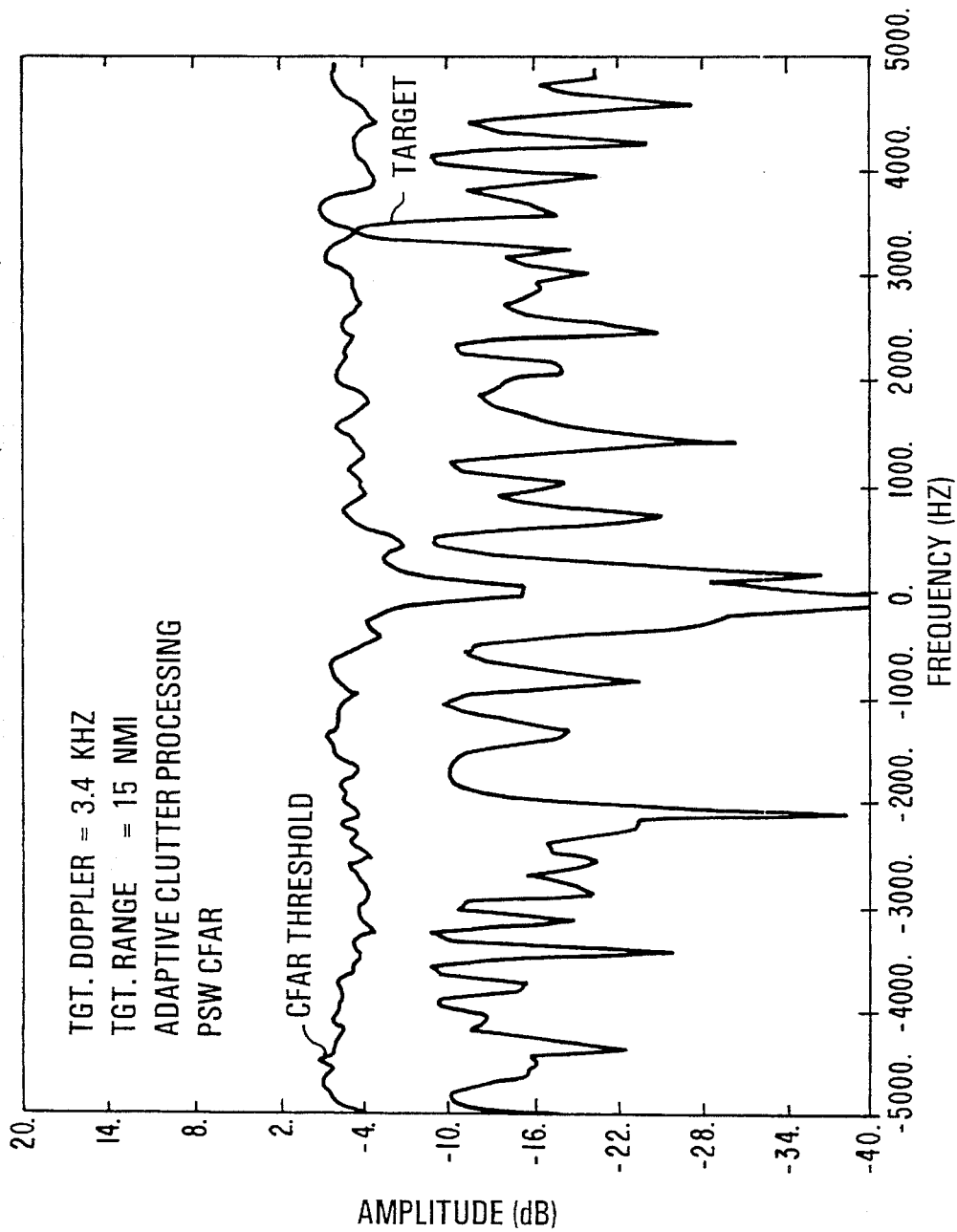

RADAR SYSTEM WITH ADAPTIVE CLUTTER SUPPRESSION

BACKGROUND OF THE INVENTION

1. Field of the Invention

The invention concerns radar systems, in particular, radar systems which seek to identify targets in clutter, especially where the targets are of low radar cross section.

2. Related Art

Airborne long range radar surveillance or fire control requires a radar system to acquire, track and identify targets. These targets can severely stress radar detection, tracking and identification capabilities if the target has a small radar cross section (RCS) and if the target return competes with land or sea clutter. Previous approaches for upgrading such radars have applied increased power aperture, waveform design and adaptive array strategies. Although other efforts have investigated advanced signal processing techniques such as space-time processing, such approaches have extremely high signal processing demands.

Small RCS targets flying near the earth's surface are the stressing case for airborne and shipborne radars because such targets are easily obscured by land and sea clutter. A target's low RCS makes its radar return much weaker than the background clutter and comparable to returns from false targets such as birds and ground moving targets. Mainbeam and sidelobe clutter returns conceal low RCS targets. Thus, increased target-to-clutter ratio is required for detection. An associated problem is the need to suppress ground clutter sufficiently without attenuating target signal. To successfully detect and track targets, an airborne or shipborne surveillance radar typically employs such techniques as Doppler filtering moving target indicator (MTI) approaches, analog or digital bandpass filtering, amplitude weighting and range gating to suppress the clutter.

FIG. 1 illustrates one scenario. An airborne platform 101 carries a radar operating in a look-down mode. In this mode the radar experiences severe clutter returns, for example from the ground, ground moving target 102 and other sources. These clutter returns increase the difficulty in detecting a small RCS target 103.

FIG. 2a is a block diagram illustrating conventional processing in a moving target indicator (MTI) radar. The output of a phase detector 201 is sampled sequentially by a plurality of range gates 203. Each range gate opens in sequence just long enough to sample the voltage of the video waveform corresponding to a different range interval in space. The range gate acts as a switch which opens and closes at the proper time and is activated by a controller (not shown) once each pulse repetition interval (PRI). An echo from a moving target produces a series of pulses which vary in amplitude according to the doppler frequency. The output of the range gate may be stretched in a boxcar generator circuit 205 to aid in the filtering and detection process by emphasizing the fundamental of the modulation frequency and eliminating harmonics of the pulse repetition frequency. A clutter rejection filter 207 is a bandpass filter whose bandpass depends on the extent of the clutter spectrum, but is typically less than one half the pulse repetition frequency. Full wave linear detector 209 and integrator 211 provide unipolar video to threshold detector 213. Only signals exceeding the threshold are reported as targets.

FIG. 2b is a more detailed illustration of typical signal processing elements in a conventional medium pulse repetition frequency (PRF) radar system. The elements shown can be implemented as individually assembled circuits, as combinations of hardware and software executed and controlled by a processor carrying out a program or by a system fully implemented in software. In phase and quadrature information is applied to analog detector 220 to generate a digital signal, for example a ten bit plus sign signal, to a range gate 222. The output of range gate 222 is applied to clutter suppression filter 224, such as a three pulse delay line canceler with binary weights. The output of the delay canceler is applied to filter 226, such as the 40 dB Dolph Chebchev weighting filter shown to reduce clutter residue. A fast Fourier transform is then performed, as shown in block 228 and the sum of the squares of the in phase and quadrature signals formed as shown in block 230. As shown in block 232, using a moving average of range cells, for example eight range cells, two guard cells and the cell of interest, an estimate of the background noise is formed. Circuitry to perform doppler and range cell blanking 234 is used to form a doppler notch to remove ground moving targets and a range notch to eliminate sidelobe discretes. Threshold comparison circuitry 236 is set for a desired false alarm rate. For systems with multiple PRFs, circuitry in block 240 is used to determine if a requisite number of thresholding crossings, e.g. three crossings in eight PRFs, have occurred. If so, a detection is indicated.

FIG. 2c illustrates typical signal processing elements in a high PRF radar. These elements are similar to those of a medium PRF radar with parametric differences as shown. In addition, another difference is the substitution of a digital high pass filter for the MTI filter used in the medium PRF radar of FIG. 2b. FIG. 2c also includes a doppler cell blanking processing element in which only selected doppler cells are examined for the presence of target returns.

Conventional airborne medium pulse repetition interval (PRF) radars typically process a radar return as depicted in FIG. 3a. Mainbeam clutter must be reduced or eliminated prior to signal detection. In an airborne radar, the mainlobe clutter must be centered at zero doppler frequency by clutter tracking circuitry 301 before being processed by the Moving Target Indicator 302.

Amplitude weighting circuitry 303, which is also used as part of the estimation and detection process, reduces clutter residue effects and reduces the interference caused by large returns spilling over into adjacent doppler cells containing small returns. The amplitude weighting circuitry typically employs a Taylor, Kaiser or Dolph-Chebychev filter. Weighting increases processing losses, lowering the target signal to noise ratio, and correlates background interference across all Doppler filters. Spectral estimation circuitry 304 then typically employs FFT techniques to transform time domain information into the frequency domain in order to further discriminate targets and clutter using Doppler frequency differences. In a radar system target detection is performed by forming the ratio of a signal estimate to a background estimate and then comparing this ratio to a threshold. The signal estimate is formed by taking the power output from range doppler cells under consideration. The background estimate may be obtained by averaging the power from cells which are within W Hz of the target doppler and R nmi of the target range. Nonhomogeneous clutter present cells close to, but outside of W Hz and R nmi, bias the estimate of the background, i.e., cause a nonrandom inaccuracy. This phenomenon occurs because of the inevitable existence of frequency or range sidelobes in the response of the radar processor. The sidelobes may be reduced in magnitude by applying a window to the data before Fourier transformation, and thereby lessening the bias. This is well known to those of ordinary skill in the art.

In addition to the above, however, it is also well known that such windows lead to a loss of energy that increases the variance of both the signal estimate and the noise estimate. This degrades the probability of detection and/or increases the probability of a false alarm. The prior art discloses that this trade-off between lessening the bias or decreasing the variance of a signal estimate may be avoided through the computation of K eigenspectra, where K is an application specific number. Each of the K eigenspectra are computed by applying one of K windows to the data and then computing the Fourier transform. The windows that are employed are drawn from the family of prolate spheroidal sequences. Prolate spheroidal window sequences have been applied to radar processing in the past, but only the first order window has been used, as opposed to windows of order 1 through K that are employed by other prior art sources. The optimal spectral estimate of the signal and its variance are computed by a formula disclosed in the prior art that involves weighted sums of the eigenspectra.

SUMMARY AND OBJECTS OF THE INVENTION

In view of the above limitations of the related art, it is an object of the invention to provide a radar system with improved detection of targets in clutter.

It is a further object of the invention to provide such a radar system with advanced clutter suppression and/or advanced spectral estimation techniques incorporated therein.

It is a still further object of the invention improve radar system performance in non-uniform clutter conditions and to reduce deleterious effects of non-homogeneous clutter in target detection.

It is a still further object of the invention to estimate signal and noise separately, with an optimal set of orthogonal windows for time and bandlimited radar returns.

It is another object of the invention to remove the mainbeam clutter return using a least mean squares regression approach to provide a system which adapts to a changing clutter environment and to reduce radar system sensitivity to clutter mistracking.

A further object of the invention is the relaxation of doppler filter weighting requirements in radar systems detecting targets in clutter.

It is a still further object of the invention to apply spectral estimation techniques to improve estimates of both potential target and background noise and clutter returns.

It is still another object of the invention to reduce background correlation across a doppler filter in a radar system.

SUMMARY OF THE INVENTION

A radar system according to the invention includes a clutter suppression apparatus. A radar signal receiver has a clutter cancellation filter dynamically matched to changing characteristics of mainbeam clutter return signals received by said receiver. The clutter cancellation filter covers an estimated clutter spectrum, wherein amplitude and phase of the clutter return are represented by a sum of sinusoids, each sinusoid being dynamically weighted according to an estimate of the clutter return. A least mean squares processor estimates the weights. The least means squares processor includes circuitry to minimize an integral of the square of the absolute value of the difference between a total radar return and the sum of sinusoids representing the clutter to determine the weights over a time span of the total radar return. An apparatus according to the invention further includes a subtractor circuit. The subtractor circuit coherently subtracts the estimated clutter return from the total radar return thereby minimizing energy associated with clutter returns in bands having clutter return signals.

A radar system according to the invention further includes a plurality of range gates, the range gates being activated by a controller at predetermined times to provide a radar return to the clutter cancellation filter. Alternatively, the system can have a plurality of range gates and a clutter cancellation filter for each range gate, each range gate being activated by a controller to provide a radar return to a corresponding clutter cancellation filter at a predetermined time. According to the invention, the clutter cancellation filter can be implemented in hardware or software or some combination thereof. Thus, the invention includes an apparatus and method for estimating clutter and forming a filter that is matched to instantaneous clutter characteristics. As a result clutter suppression is improved and there is less leakage of clutter to interfere with target detection.

In another aspect of the invention, sidelobe discrete interference and altitude line interference are suppressed. Sidelobe discrete suppression is accomplished by applying the doppler information from the adaptive clutter suppression filter according to the invention to a guard channel to cancel the discrete without affecting weak target returns. Clutter suppression according to the invention can also be applied to the range cell containing the altitude line, to coherently remove this clutter return also.

In another aspect of the invention, prolate spheroidal windows (PSW) are employed to form a PSW spectral estimation system that reduces errors in estimating background level and the signal prior to detection. Using prolate spheroidal windows, orthogonal, windowed data such as independent observations of background level are processed by a fast Fourier transform to obtain estimates of the amplitude in each doppler filter. A prolate spheroidal window processor applies a copy of a clutter suppressed signal, obtained for example from a conventional clutter suppression technique or the adaptive clutter suppression technique disclosed herein, to different prolate spheroidal sequences as windows, thereby providing a plurality of realizations of a corresponding spectrum. The prolate spheroidal processor forms a plurality of finite impulse response minimum leakage filters producing a minimum variance, low bias estimate of power in the spectrum.

BRIEF DESCRIPTION OF THE DRAWINGS

The invention is described herein with reference to the drawings in which:

FIG. 9b illustrates a three-pulse dual delay line canceler that can be used to replace the two-pulse single delay line canceler in FIG. 9a;

FIG. 12 illustrates signal processing elements in an apparatus according to the invention;

FIGS. 16a–e show prolate spheroidal sequences, K=0 to 4, for a time bandwidth product equal to four;

FIGS. 18a and 18b illustrate prolate spheroidal window processing for the MPRF and HPRF modes, respectively;

FIGS. 20a and 20b illustrate performance in the MPRF and HPRF modes, respectively.

DESCRIPTION OF THE PREFERRED EMBODIMENTS

Figure 1:
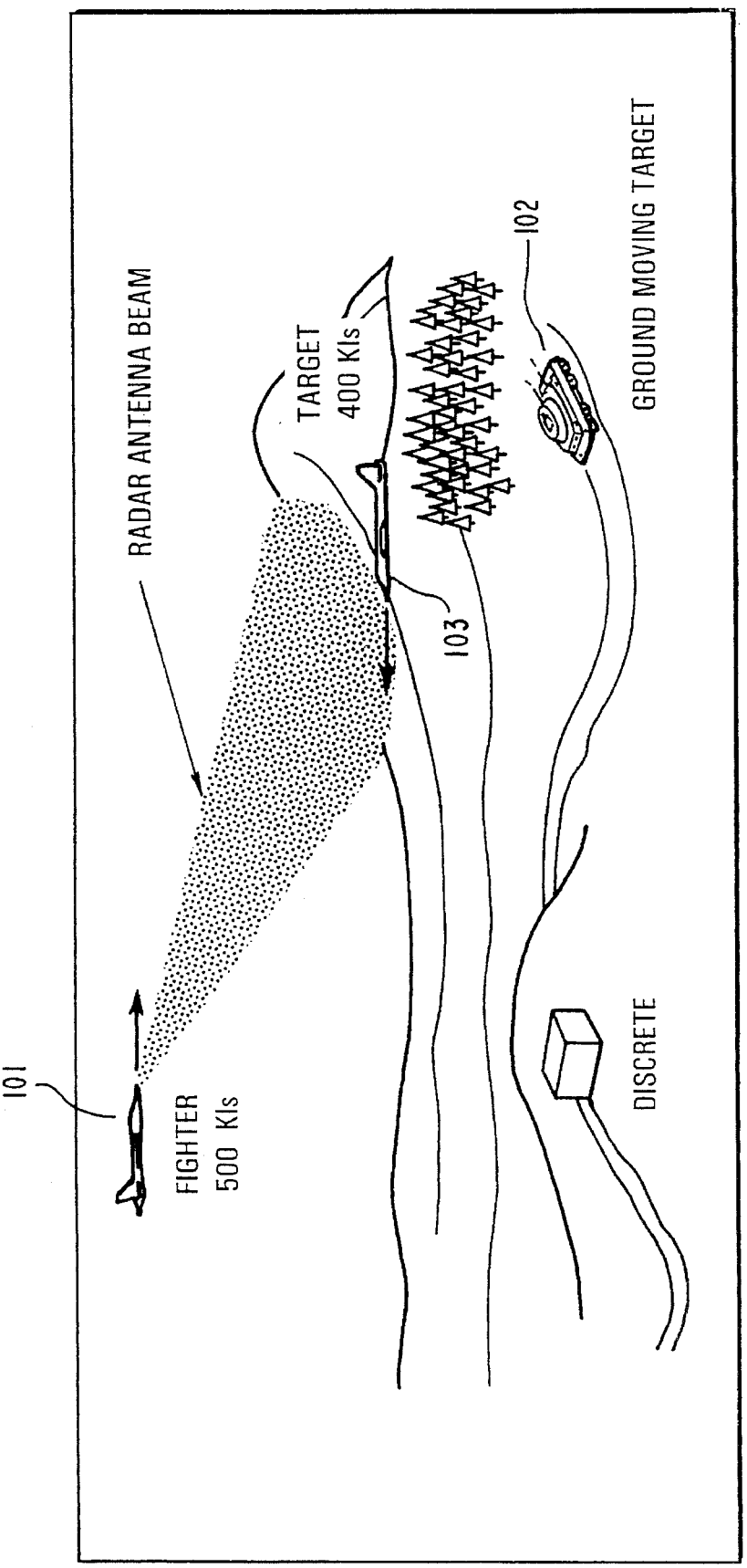
FIG. 1 illustrates a typical look-down scenario for an airborne radar.
Figure 2A:
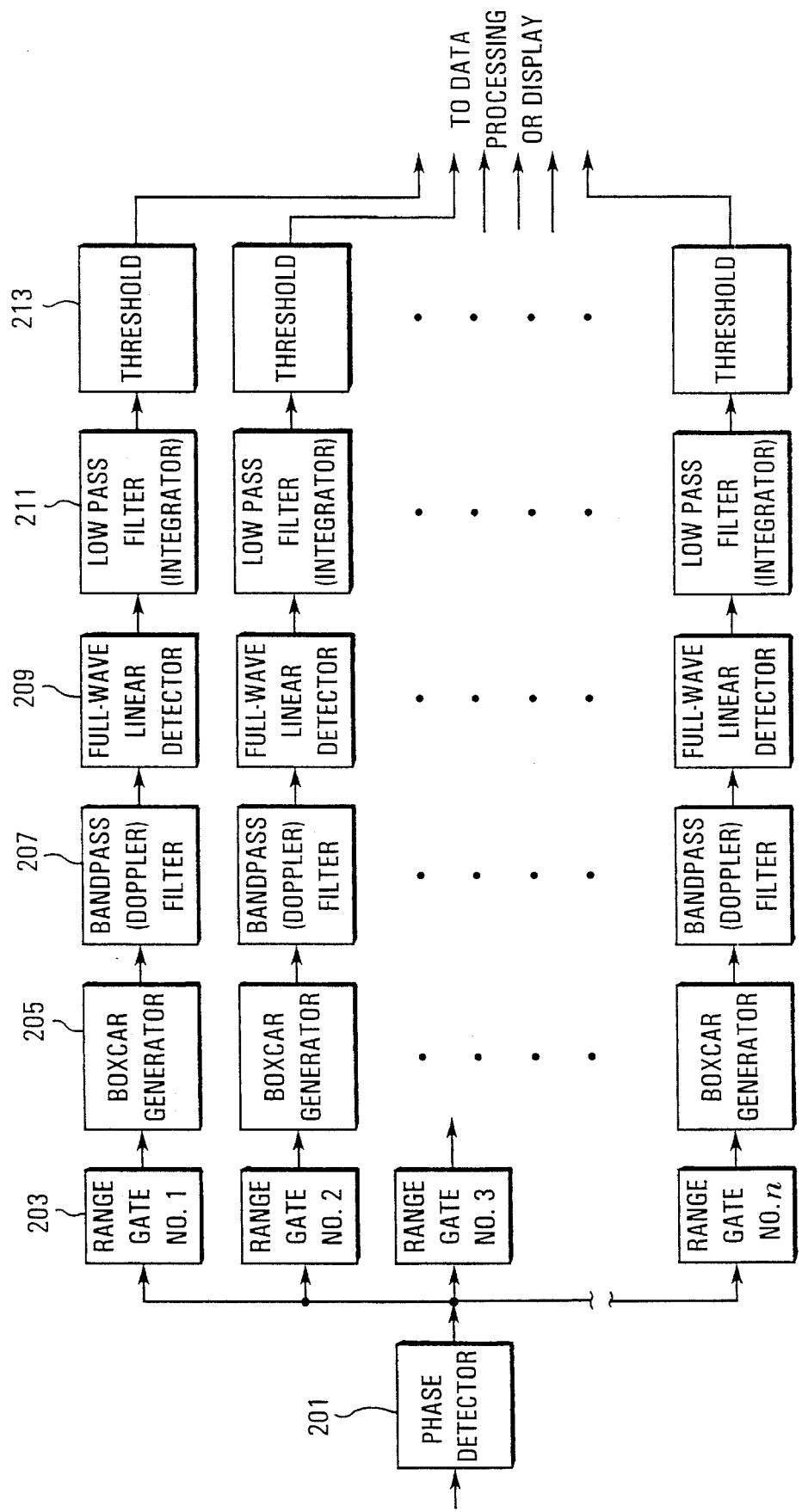
FIG. 2a illustrates an MTI radar system.
Figure 2B:
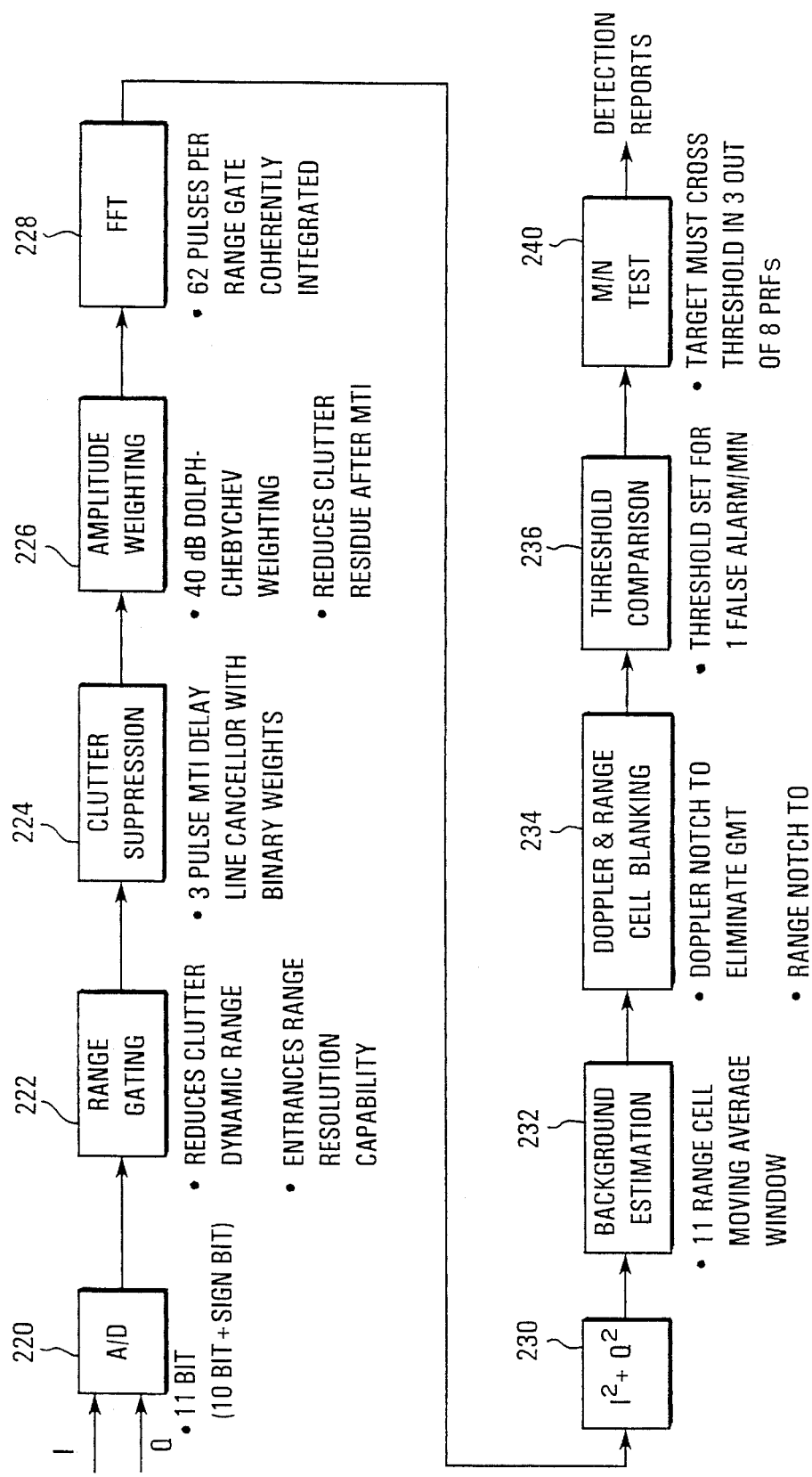
FIG. 2b illustrates the elements of a conventional MPRF radar system.
Figure 2C:
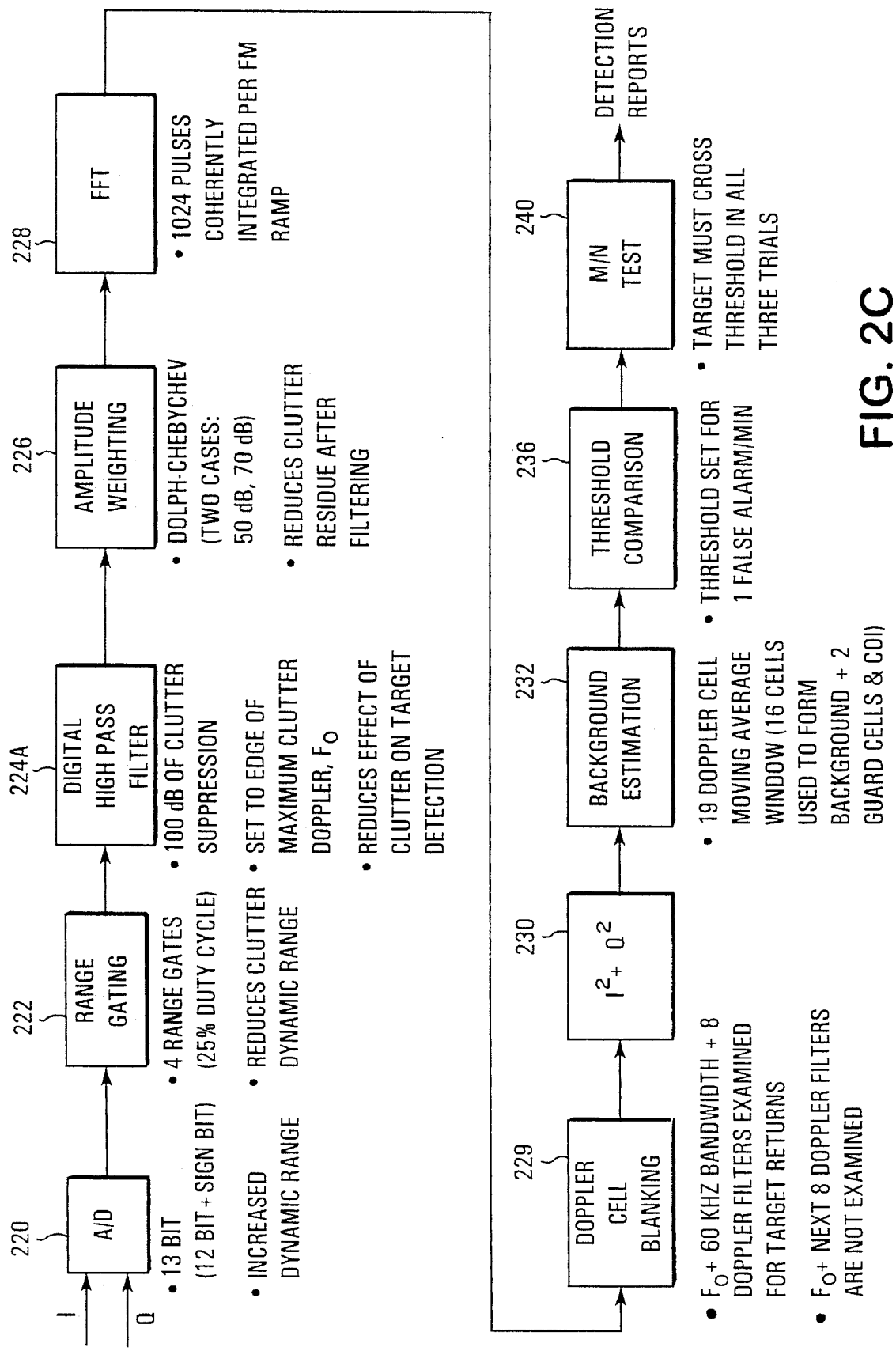
FIG. 2c illustrates a conventional HPRF radar system.

A system according to the invention adaptively eliminates MTI processing, as shown in FIGS. 2a and 2b and employs circuitry which tracks and removes mainbeam clutter with an adaptive notch without a loss in signal to noise ratio (SNR) in doppler regions (range cells) removed from the mainbeam clutter. The system according to the invention can be modified to remove the altitude line return. In addition, a system according to the invention can be adapted to remove sidelobe discretes when guard channel information is available.

A system according to the invention operates to subtract coherently mainlobe clutter using a Least Mean Squares estimate of the clutter obtained with a fast Fourier transform (FFT) apparatus. The spectral width of the clutter can be determined a priori or can be measured in real time. This estimate of the clutter can then be subtracted from each clutter Doppler filter for all range cells. This process according to the invention adapts to changing clutter conditions and offers reduced loss when compared to conventional systems. This improved performance is possible in a system according to the invention because no windowing of data is necessary in the signal path, as is required in conventional systems.

Throughout this disclosure, the following assumptions and notation are used:

1. The inputs to a clutter processor are modelled as $$x(t)=c(t)+s(t)+n(t)$$

where
c≡clutter return
s≡target return
n≡receiver noise 2. n is a zero mean, WSS, white, band limited, Gaussian noise process, i.e.;

$$E\{n\} = 0 \quad \text{(a)}$$
$$E\{n(t_2)\} = E\{n(t_1)n(t_1 + \tau)\}, \tau = t_2 - t_1 \ \forall \ t_1, t_2 \quad \text{(b)}$$

$$E\{|N|^2\} = \begin{cases} N_0/2 & |f| \leq B \\ 0 & |f| > B \end{cases} \quad \text{(c)}$$

where
E is the expectation operator
N is the Fourier transform of n
B is the noise bandwidth (i.e., the sampling bandwidth)
$N_0$ is the noise spectral density 3. The signal and clutter returns are uncorrelated with the noise, i.e., $$E\{c(t)n(t)\}=0 \quad \text{(a)}$$

$$E\{s(t)n(t)\}=0 \quad \text{(b)}$$

4. The mainbeam clutter return is the largest signal seen by the radar

5. The doppler shift of the mainbeam clutter return varies only slightly from range cell to range cell, i.e., the doppler shift of the mainbeam clutter return changes in a slow continuous fashion from range cell to range cell.

6. The clutter return in any given range cell is stationary for a given PRF dwell time, i.e., the amplitude, phase and doppler shift of the clutter returns are nearly constant from the time that the radar begins transmitting at a one PRF until the radar begins transmitting at the next PRF.

Figure 7:
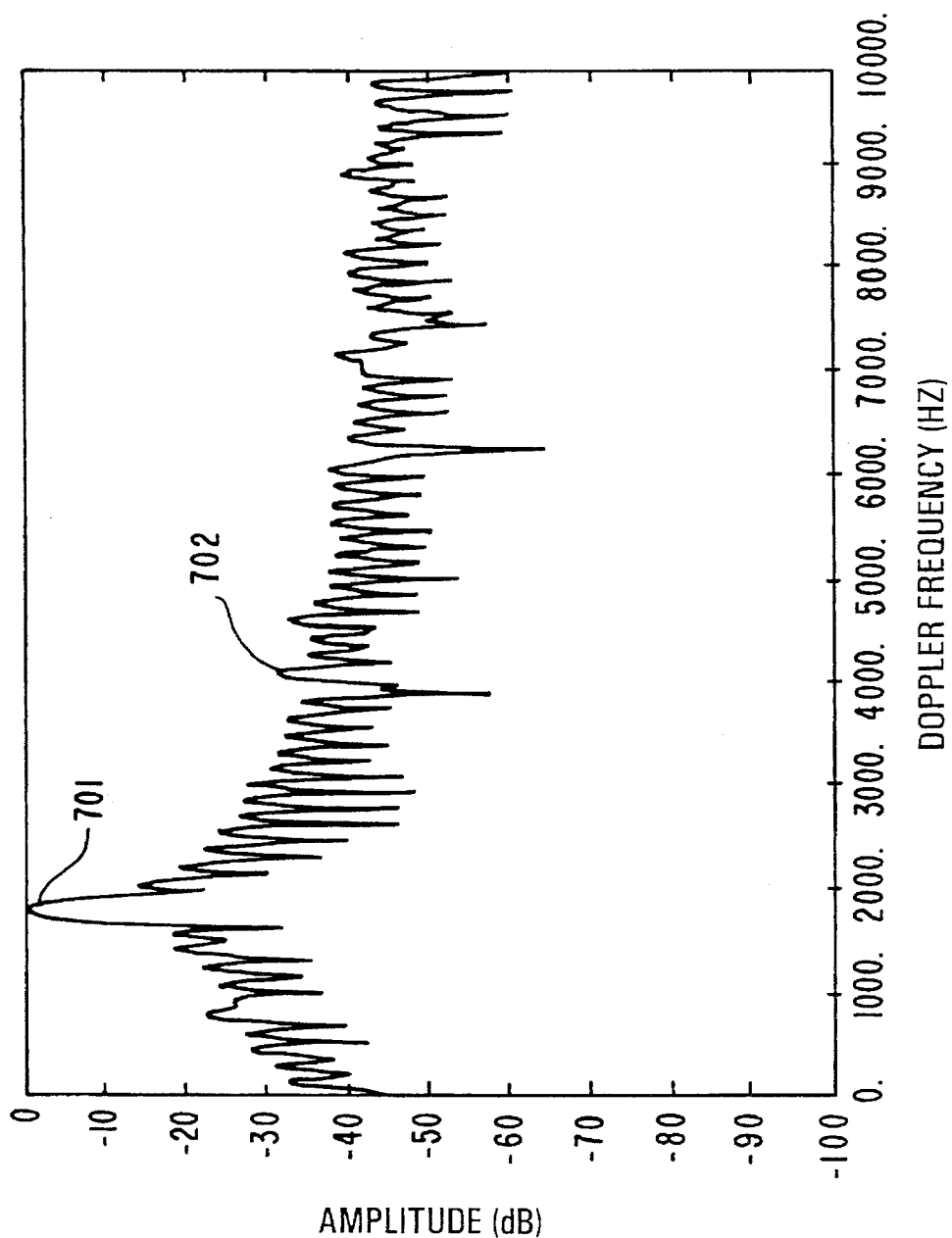
FIG. 7 illustrates a typical sin x/x waveform in the doppler domain.

Mainbeam clutter's interference with target detection in doppler regions removed from the mainbeam clutter, typically results from spillover or leakage of the clutter through doppler sidelobes into other doppler filters. This leakage occurs because waveforms used by a radar are time limited and will, without additional windowing, exhibit a sin x/x type behavior in the doppler domain, as illustrated, for example, in FIG. 7. In this example, the mainbeam clutter return 701 is centered at approximately 1800 Hz with a clutter to noise ratio (CNR) of approximately 50 dB. A target return 702 is also present at approximately 4000 Hz with an SNR of about 14 dB. This target is return is barely noticeable due to the interference of the clutter spillover.

Figure 8:
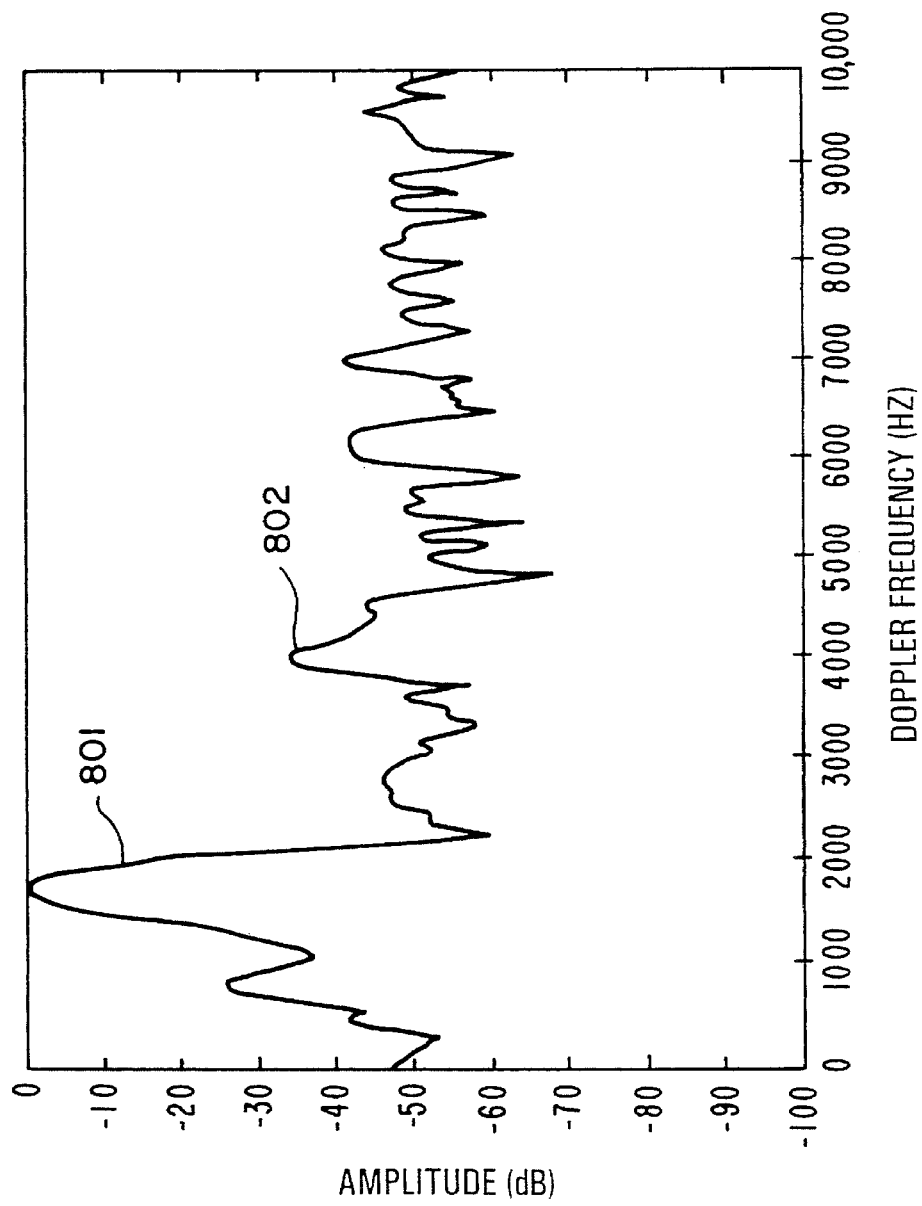
FIG. 8 illustrates the effect of windowing on the sin x/x waveform shown in FIG. 7.

A conventional method of reducing the effects of clutter on target detection uses windows to reduce the effect of leakage by suppressing the doppler filter sidelobes to the level of the noise or below. The effect of this windowing is shown in FIG. 8. In this case, the data was windowed with Dolph-Chebyschev weights designed to produce doppler sidelobes 60 dB below the peak clutter level. As can be seen, the doppler sidelobes of the mainbeam clutter return 801 are no longer evident and the target return 802 is clearly visible. This type of conventional processing, however, has drawbacks. First, the mainlobe doppler response is broadened, i.e., there is a loss in doppler resolution, incurred in the use of these windows. The window used in this example results in a loss of approximately 1.4 dB, which is typical for the types of windows used in conventional systems. As a result of this loss, the probability of detection ($P_d$) of a target with an SNR of 12.4 dB prior to windowing decreases from 0.5 to 0.22. When using a 16 range cell averaging type constant false alarm rate (CFAR) process with a threshold setting for a probability of false alarm ($P_{fa}$) of $10^{-5}$.

Figure 9A:
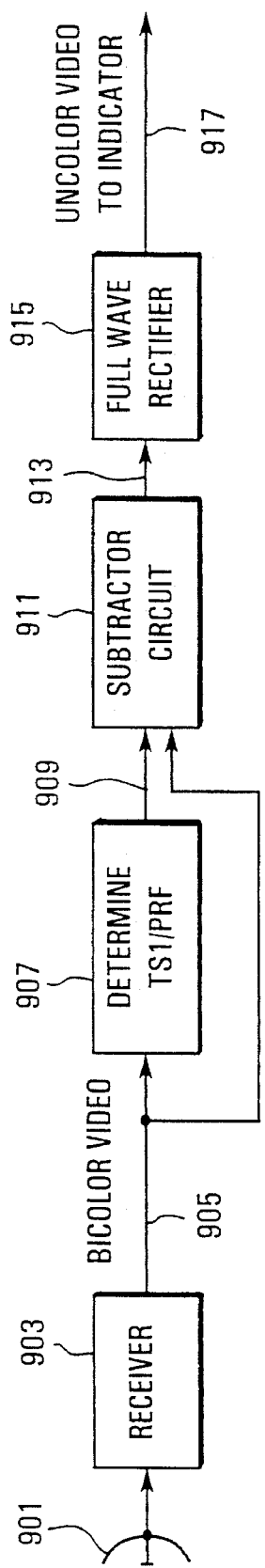
FIG. 9a illustrates a system employing a two pulse single delay line canceler.
Figure 9B:
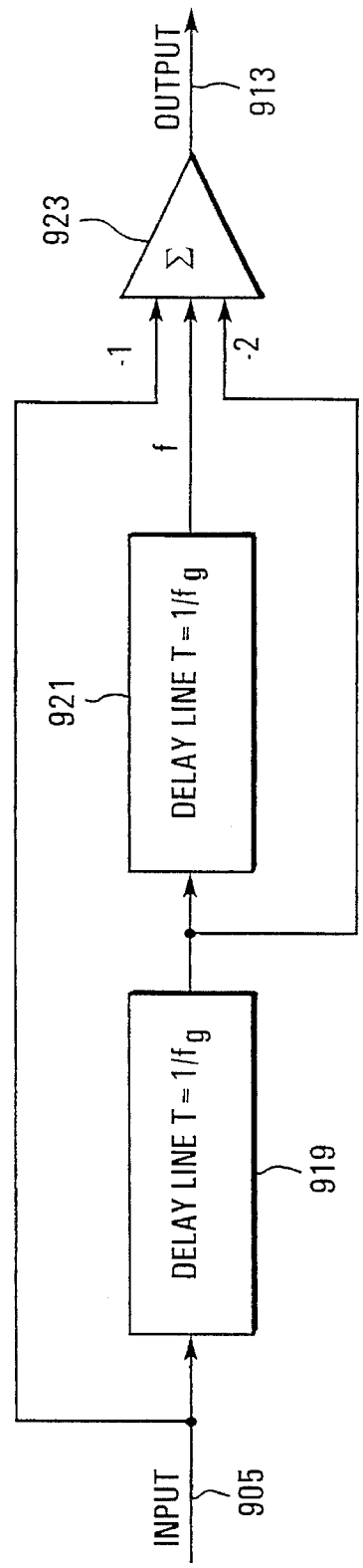

Another conventional method used to suppress mainbeam clutter is an AMTI technique shown in FIGS. 9a and 9b.

In FIG. 9a receiver 903 receiving inputs from antenna 901 produces a bipolar video signal or pulse on signal line 905. Delay line 907 delays the bipolar video signal by a time equal to the inverse of the pulse repetition frequency and produces a delayed bipolar video signal or pulse on line 909. The delayed bipolar video on signal line 909 and the undelayed bipolar video on signal line 905 are routed to subtractor circuit 911. The difference between the two pulses is provided over signal line 913 to rectifier 915, which provides unipolar video to a display over signal line 917.

Figure 10:
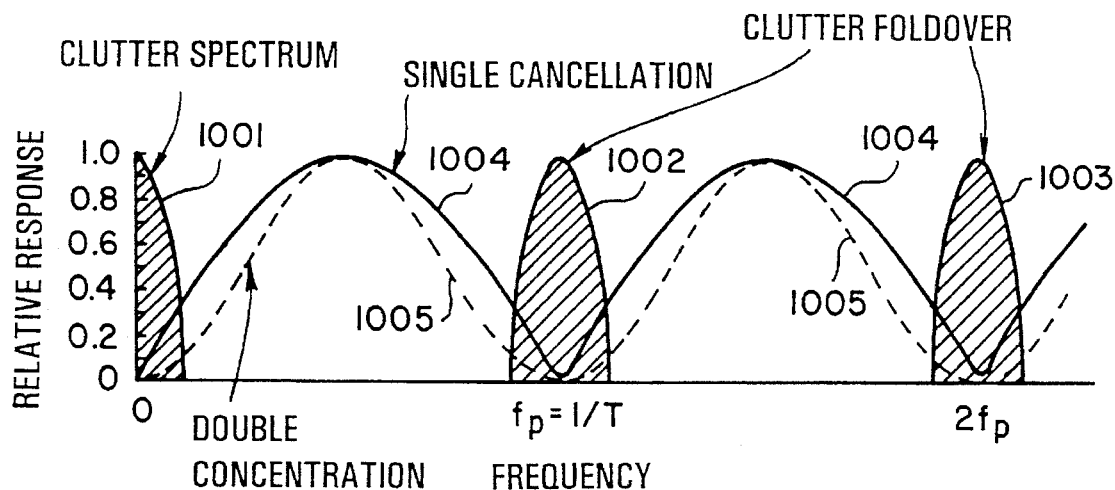
FIG. 10 illustrates the frequency response of systems with two-pulse and three-pulse delay line cancelers.

The three-pulse dual delay line canceler shown in FIG. 9b replaces single delay line 907 and subtractor 911 with delay lines 919 and 921 and summer 923. The relative frequency responses are shown in FIG. 10, in which 1001 is clutter spectrum and 1002 and 1003 represent clutter foldover at the pulse repetition frequency (PRF) and twice the PRF. Line 1004 is the response of the system with the single delay line, two-pulse canceler in FIG. 9a and line 1005 represents the frequency response of a system with a dual delay line three-pulse canceler as shown in FIG. 9b.

While these filters suppress clutter, they cause a loss in signal to noise ratio (SNR) in doppler regions removed from the mainbeam clutter. With a two-pulse canceler using binomial weights, there is at least a 3 dB signal loss in over half the passband. In addition, as previously noted the AMTI requires heterodyning the mainbeam clutter return to DC before cancellation. Errors in heterodyning lead to increased false alarms due to clutter residue and the possible cancellation of target returns which have been improperly heterodyned to DC. Finally, the width of the clutter notch is usually fixed. If the doppler extent of the clutter is greater than the width of the notch, there is a rise in the number of false alarms. The width of the notch can be made variable. Increasing the width of the notch, however, can only be done at the expense of decreasing signal return in doppler regions away from the notch.

A system according to the invention includes a clutter cancellation filter which is dynamically matched to characteristics of the mainbeam clutter. This is accomplished by finding a set of complex weights or coefficients in the band of frequencies containing the clutter returns, such that the energy in this band of clutter returns is minimized. A clutter cancellation filter according to the invention has little or no SNR loss in the passband, since the cancellation filter has been matched to the mainbeam clutter spectrum.

Figure 11:
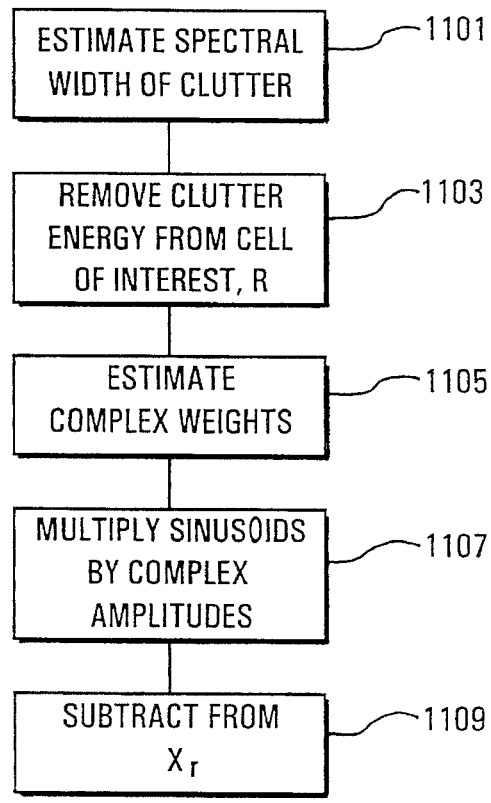
FIG. 11 is a flow diagram illustrating a clutter suppression process according to the invention.

An implementation of a clutter cancellation filter according to the invention is in a processor carrying out a process, as shown in FIG. 11 to provide adaptive clutter suppression.

FIG. 12 illustrates signal processing flow in an apparatus according to the invention. It will be known to those of ordinary skill that an adaptive clutter cancellation filter according to the invention can be implemented in a central or distributed processor system executing a control program stored in permanent memory and providing RAM or other memory for temporary storage. Elements of such a system can also be implemented in hardware. In the process shown in FIG. 11, step 1101 is the estimation of the spectral width of the clutter. Typically heading and speed information provided from an onboard navigational system and antenna pointing angle relative to aircraft heading are used to estimate the spectral width of the clutter. Techniques for estimating the spectral width of clutter are conventional.

In step 1103, the clutter energy is removed from the range cell of interest, k. Where $x_k(t)$, shown on signal line 1201 in FIG. 12, represents time domain returns from range cell k, $x_k(t)$ includes receiver noise $n_k(t)$, signal return $S_k(t)$ and clutter return $C_k(t)$. The clutter return can be represented by a range of sinusoids with unknown amplitudes and phases. However, within the accuracy of a doppler cell size, the frequencies are known. Thus, the clutter in range cell k can be represented as:

$$c_k(t) = \sum_{n=1}^{N} a_n e^{2\pi i f_n t}$$

where, $a_n$ is the complex amplitude (amplitude and phase) of the sinusoid at frequency $f_n$ and N is the number of sinusoids.

The next step in implementing a clutter cancellation filter according to the invention is to estimate the complex weights, i.e. the $a_n$'s in the band of frequencies containing the clutter returns, as shown in step 1105. This estimation of the complex weights, $a_n$, is accomplished using a least mean squares (LMS) minimization technique, for example, as shown in LMS processor 1203.

Let $$I = \frac{1}{T} \int_0^T \left| x_k(t) - \sum_{n=1}^{N} a_n e^{2\pi i f_n t} \right|^2 dt$$

where T is the time span of $x_k(t)$. This integral is minimized with respect to each of the $a_n$'s. The resulting matrix equation is then solved producing the desired $a_n$'s on signal line 1204. In step 1107 according to the invention, the sinusoids are then multiplied by the corresponding complex amplitudes an, as shown for example in multiplier 1205. In step 1109, the resulting signals $C_k(t)$ on signal line 1206 are coherently subtracted for example, in subtractor 1207, from $x_k(t)$. The result of this subtraction is to leave only thermal noise, possible target returns or sidelobes discretes, and minor residue from the clutter cancellation process on signal line 1208. In this way the clutter is removed without reducing the signal to noise ratio.

The residue from the clutter cancellation filter process just described arises chiefly from imperfect knowledge of the exact clutter return frequencies. Although the mainbeam clutter returns are continuous in frequency, the nature of digital signal processing and the FFT is such that the frequencies can only be approximated to quantized values of the resulting filter center frequencies. This quantization results in an imperfect match in the clutter cancellation and therefore leaves a residue. Residue effects can be alleviated by using a finer frequency resolution. For large mainbeam clutter to noise ratio (CNR), the residue will usually produce false peaks no more than one or two doppler filters on either side of the cancellation band.

It is important to note that the clutter cancellation filter process and apparatus according to the invention goes beyond merely zeroing the output from the appropriate FFT filter. Merely zeroing the output from a doppler filter will not remove the spillover of signal energy from that filter into other filters. The adaptive clutter canceler according to the invention is specifically designed to remove this sin x/x spillover.

Figure 13A:
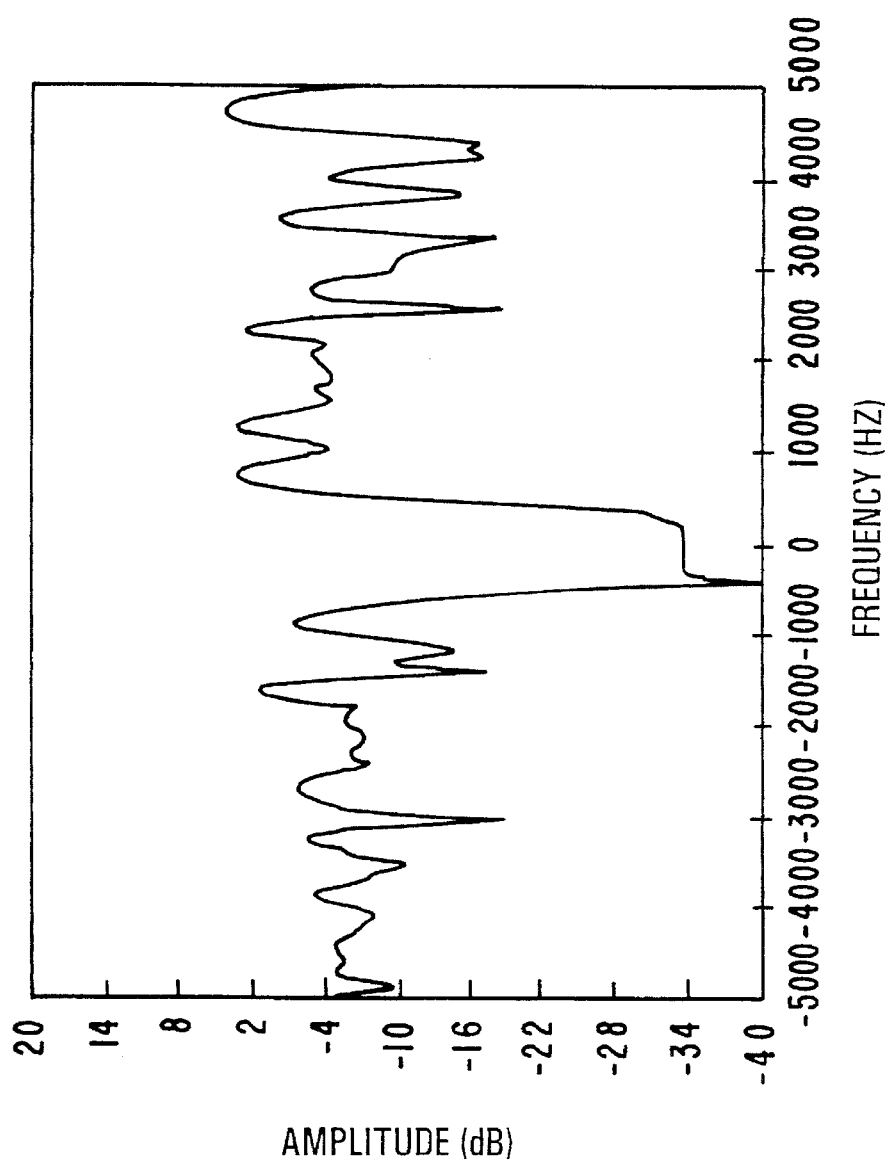
FIG. 13a illustrates a clutter suppression response plot using adaptive clutter suppression according to the invention and can be compared to the response plot in FIG. 6.
Figure 13B:
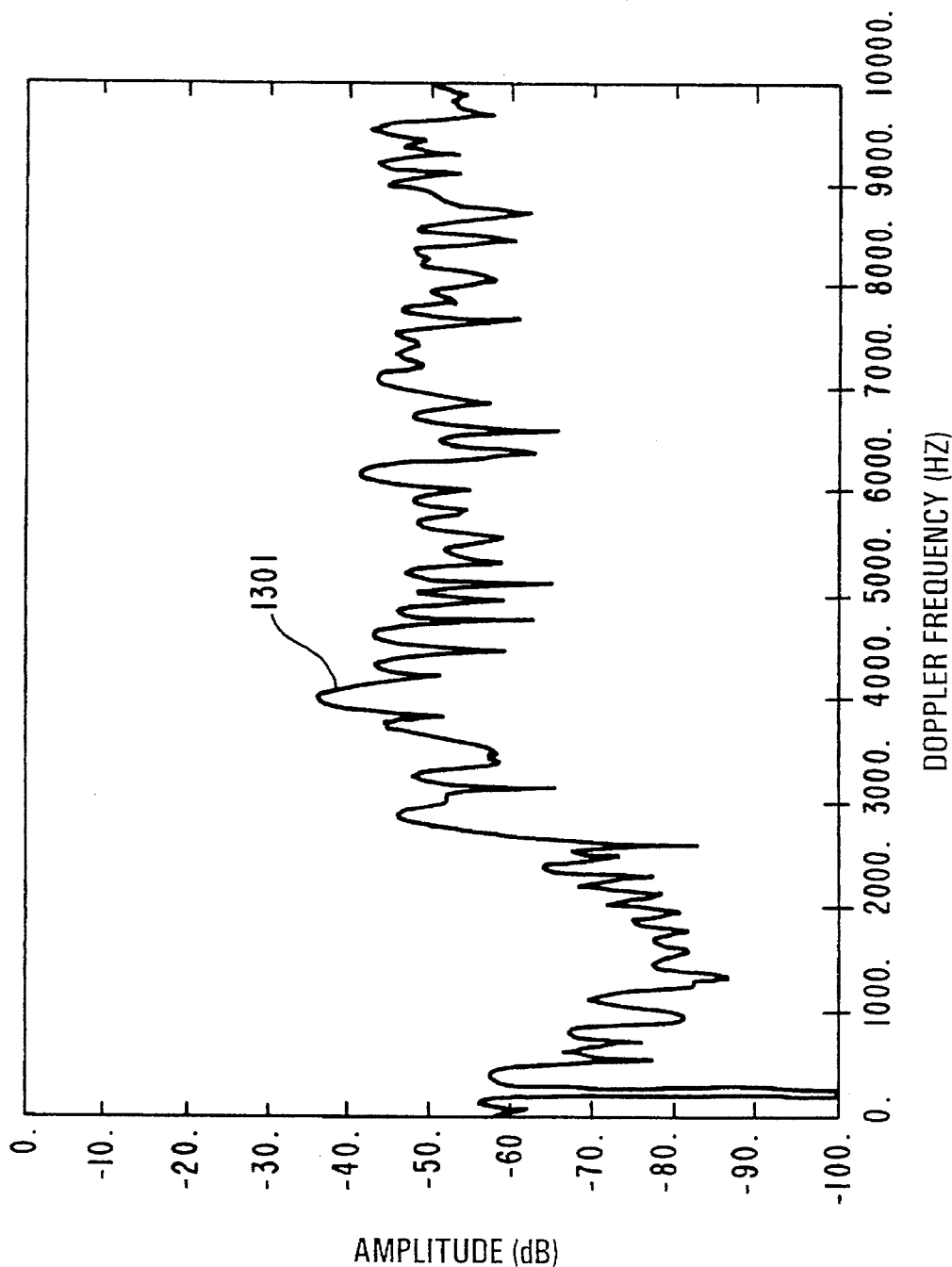
FIG. 13b illustrates the results of applying clutter suppression according to the invention to the doppler response of FIG. 7.

FIG. 13a shows the clutter suppression response when using adaptive clutter suppression according to the invention. FIG. 13b shows the result of applying the clutter cancellation filter according to the invention to the data which generated the doppler response in FIG. 7. The clutter has been removed and the target 1301 is clearly visible without a loss of 1.4 dB in SNR from the windowing in the spectral estimation stage.

Sidelobe discretes are produced when a large radar cross section illuminated by a sidelobe begins to look like a target. Sidelobe discretes can be removed using the adaptive clutter suppression filter according to the invention and an adaptation of conventional guard channel processing. In conventional guard channel systems, radar returns are collected through the main antenna and an auxiliary omni antenna. They are processed in the same manner and then compared. If the return in a given range-doppler cell in the omni channel is larger than the corresponding return in the main antenna channel, the return in the range-doppler cell is considered a sidelobe discrete and is then blanked in the main channel. Such processing would also blank any weak target returns which may be near the discrete doppler frequency. However, by using the doppler information provided by the guard channel, the adaptive LMS clutter suppression filter according to the invention can coherently cancel the discrete with little or no effect on weak target returns which may be near the discrete doppler.

Another use of the adaptive clutter suppression filter according to the invention is suppression of the altitude line return. The altitude line is a special category of sidelobe clutter characteristic of the return from directly below an aircraft. The altitude line return appears as a large amplitude response, narrow spectral content signal, predominantly at zero doppler. Since the range cell containing the altitude line can be calculated, the clutter suppression according to the invention can be applied to this cell by coherently removing the return near zero doppler frequency.

The adaptive clutter suppression filtering according to the invention is capable of adaptively removing mainbeam clutter and its effects on targets in doppler regions removed from the mainbeam clutter. It can perform this function without the loss in target SNR associated with windowing or AMTI. Further, unlike AMTI it does not have a fixed notch width. By removing the limitation imposed by windowing and AMTI, enhanced detection performance and a lower number of false alarms are achieved.

Another aspect of a system according to the invention offers improved performance over conventional CFAR thresholding in which the estimate of power output in a range/doppler cell of interest includes signal power, noise power, and a cross term resulting from interaction of the signal with background noise. Assumptions about range/doppler data samples are therefore invalidated by the presence of targets and interference, nonuniform clutter, nonstationarity and bandlimiting. These factors in conventional systems combine to produce a poor signal power estimate and degrade detection, since the required increase in the CFAR detection threshold lowers the probability of detection, especially for low signal to noise ratio.

In a system according to the invention orthogonal windowed data, such as independent observations of background level obtained from Prolate Spheroidal Windows (PSW), are processed by an FFT apparatus to form an estimate of the amplitude in each Doppler filter. The multiple projections of the Doppler spectra provide independent signal and noise estimates from time series data for a single range bin. As a result, the effects of interference and non-uniformities as a function of range are limited. The use of prolate spheroidal windows maximizes signal energy of the Doppler bin under consideration and minimizes the effects of targets and interference in doppler cells outside the PSW window. As a result, the background correlation across Doppler filters is reduced and a better (lower variance) estimate of the background is obtained with or in the alternative fewer range or Doppler cells than those of conventional systems.

Employing improved CFAR thresholding according to this aspect of the invention results in a more accurate estimate of the signal amplitude, as well as a more accurate estimate of the noise background. The advantages are three-fold. First, a better estimate of signal amplitude results in enhanced detection performance. Second, when used in conjunction with adaptive clutter suppression described herein, the improved CFAR thresholding according to the invention can be used to form a better background estimate. Third, it can provide high resolution, minimum variance, low bias estimates from a finite record of a bandlimited wide-sense stationary time series. This is important, since the amount of data used to form an estimate is always finite and has generally been collected at the output of a bandpass filter. All these advantages are accomplished by using multiple orthogonal representations of the doppler spectra, obtained through the use of prolate spheroidal data windows. In order to simplify the disclosure of the improved CFAR thresholding method and apparatus according to the invention, we assume that the effects of clutter on the target doppler filter have been suppressed, for example, by conventional AMTI techniques or by adaptive clutter suppression as discussed previously herein.

Figure 14:
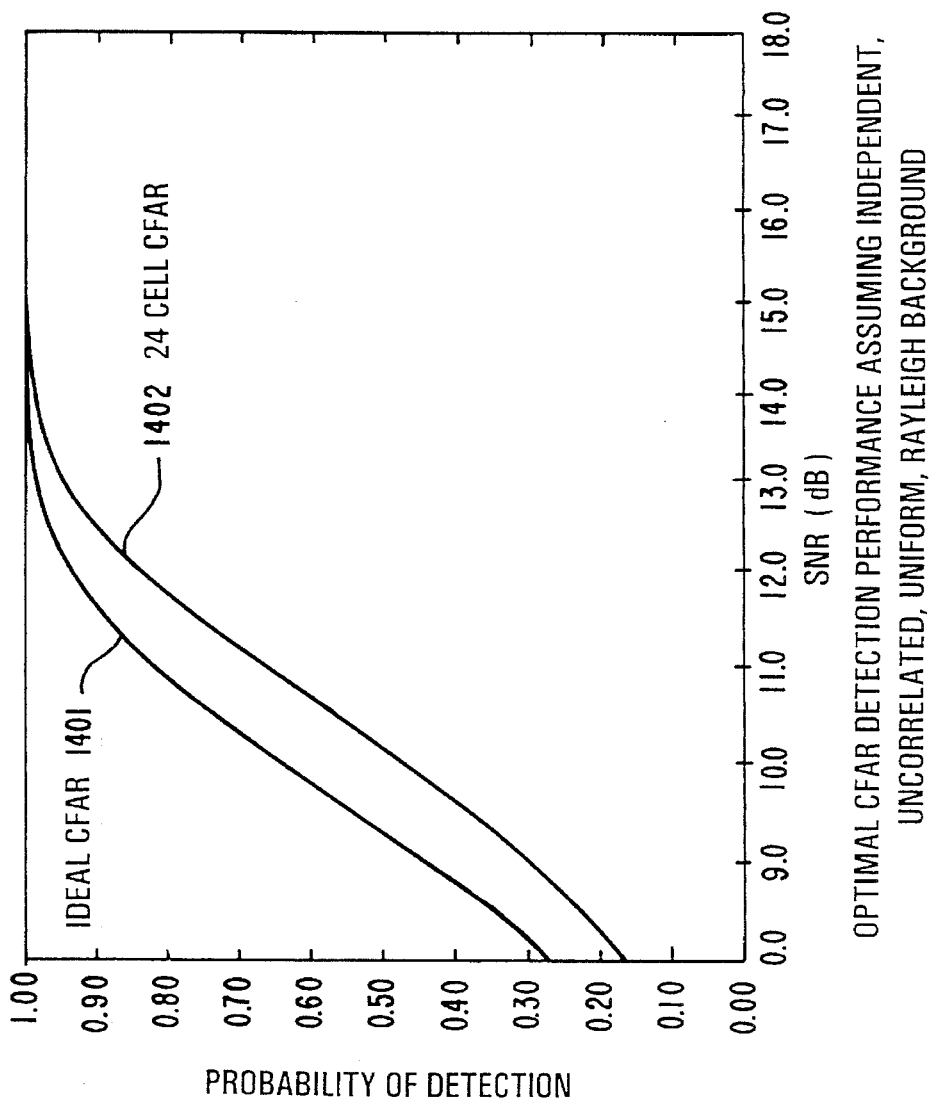
FIG. 14 illustrates performance of a system using conventional CFAR thresholding.

As previously noted, conventional CFAR thresholding techniques determine presence of a target signal in a range/doppler cell of interest by comparing the received output of the reference cell to some constant times an estimate of the noise background. This constant is determined based on the signal-to-noise ratio required to achieve a defined false alarm rate. An "ideal" CFAR would use perfect knowledge of the noise background to form the detection threshold. On curve 1401, FIG. 14 shows the probability of detection as a function of signal to noise ratio for an ideal CFAR with a false alarm rate of $10^{-4}$. An ideal CFAR is not physically realizable and represents an upper bound on performance of any practical CFAR detector.

A cell-averaging CFAR averages N samples of the noise background from adjacent range, doppler, or scan measurements. The N-cell CFAR is based on an assumption that each of the N samples are statistically identical and independent. P. Bogler in *Radar Principles With Applications to Tracking Systems*, pg. 44, (1990) discloses that the cell-averting CFAR detection threshold must be set higher than an ideal CFAR threshold in proportion to the variance of the noise estimate, resulting in CFAR loss. Assuming that twenty four identical, independent Rayleigh distributed noise samples are used to set a CFAR square law detector threshold for a false alarm rate of $10^{-4}$, E. Brookner in *Radar Technology*, pg 405, 1977 discloses that the CFAR loss is approximately 0.8 dB. The resulting probability of detection as a function of signal to noise ratio is shown in FIG. 14 on curve 1402.

In practice, assumptions about the noise samples of a cell-averaging CFAR are not met and the result is degradation in CFAR performance in the form of detection loss or false alarms. Targets or interference occurring in nearby range or doppler bins used to form the noise estimate raise the threshold, which results in additional CFAR detection loss. A cell-averaging CFAR must therefore trade off the use of a large number of cells to reduce the variance of the noise estimate against the use of a limited number of cells to eliminate unwanted interference or non-stationarities. The detection threshold is set based on an assumption that the noise is Rayleigh, or some other a priori known distribution. As disclosed by R. Blantz in *Radar Range Performance Analysis*, p. 337 (1986), if assumptions about the noise distribution are incorrect, the result will be increased false alarms or additional detection loss. In addition, the assumption that noise samples are independent is inaccurate because of bandlimiting and time-limited data sequences.

A major problem in time-series analysis is the choice of a method that yields a minimum-bias, consistent spectrum estimate from a finite sequence of data. "Spectrum Estimation and Harmonic Analysis" by David J. Thomson, Proceedings of the IEEE, Vol. 70, No. 9, pp. 1055–1096, September 1982 is considered the definitive work on classical spectrum estimation. Classical spectrum estimation attempts to derive low variance spectral power estimates over a narrow frequency band from a time series of data. This approach uses multiple windows applied to the time series of data which is then Fourier transformed to obtain multiple orthogonal representations of the spectra.

H. L. Van Trees discloses in *Detection, Estimation, and Modulation Theory*, Part I, pg. 193, Harry L, Van Trees, 1968, that band limited stationary processes can be characterized in terms of a linear integral equation whose solution is a set of eigenfunctions called prolate spheroidal wavefunctions. When a bandlimited process [−W,W] is observed over a T-second interval, there are only (2TW+1) significant eigenvalues, e.g., the signal energy is concentrated in the first (2TW+1) eigenvalues. Because the eigenvalues rapidly approach zero after (2TW+1), a good approximation to the spectra is achievable with a finite number of functions. A finite sequence of prolate spheroidal wavefunctions, called prolate spheroidal sequences, are relevant to CFAR estimation because they have the important property that, of any set of sequences of duration T, their Fourier transforms have the maximal energy in the bandwidth [−W,W]. In the Prolate Spheroidal Window (PSW) CFAR estimation method and apparatus according to the invention, this information is used to provide an accurate estimate of a doppler target signal while minimizing adjacent doppler noise and target interference.

Figure 15:
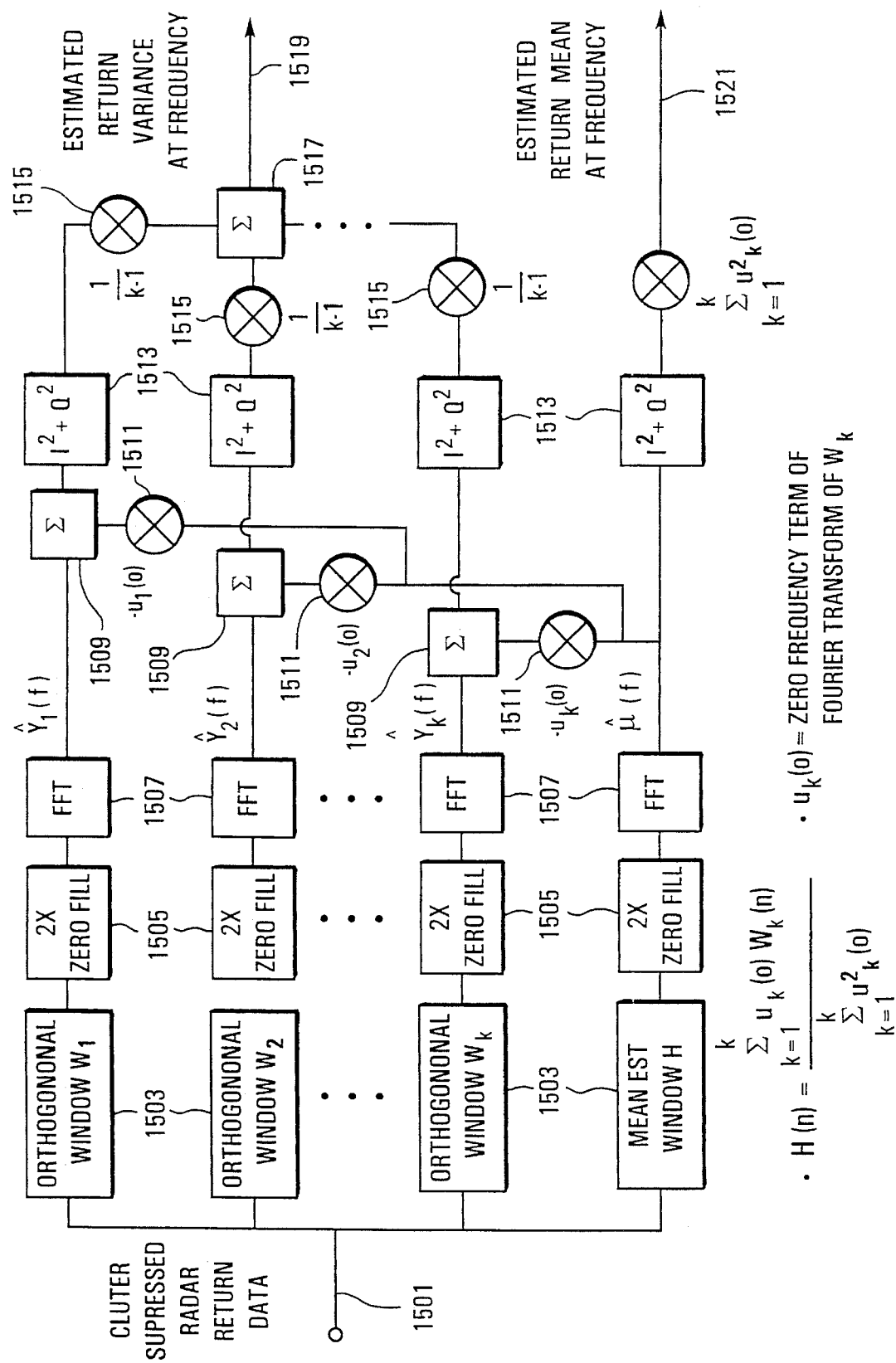
FIG. 15 illustrates an apparatus for prolate spheroidal window spectral estimation.
Figure 16C:
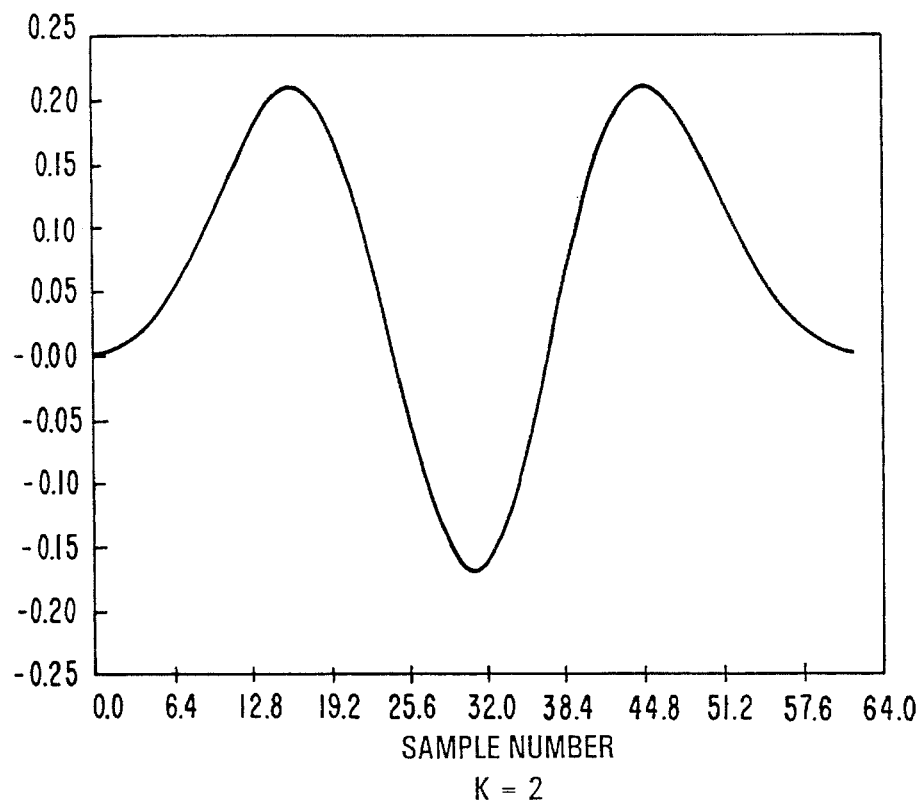
Figure 16D:
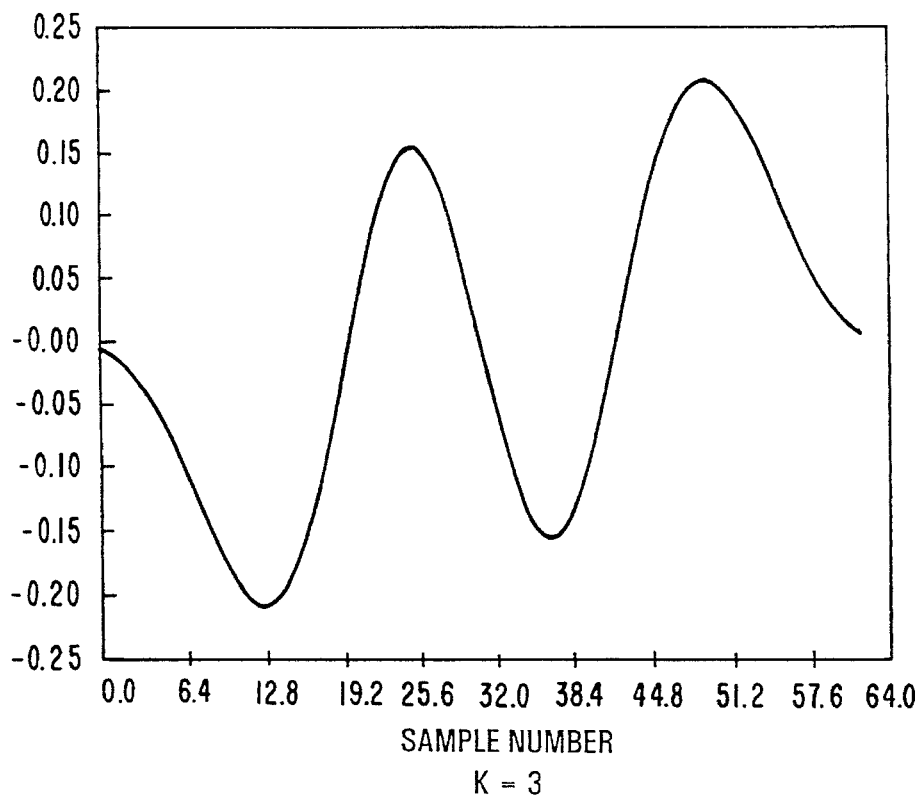
Figure 16E:
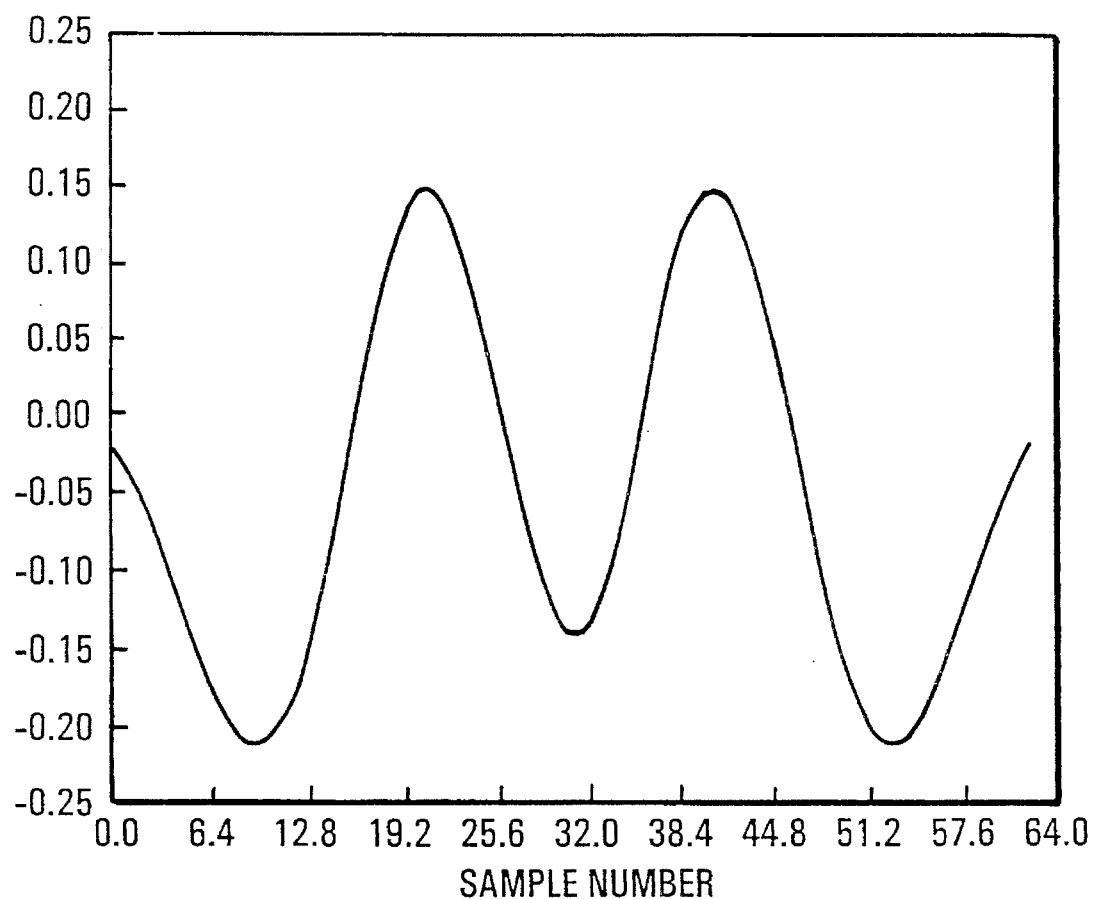

As shown by D. Slepian in "Prolate Spheroidal Wave Functions, Fourier Analysis, and Uncertainty-V; The Discrete Case," Bell Syst. Tech. J., Vol. 57, pp 1371–1429 (1978) the set of data windows, known as discrete prolate spheroidal sequences, are fundamental to the study of discrete time- and frequency-limited systems. Since CFAR processing involves doppler estimation from a finite time series of bandlimited data, they are extremely useful in signal-to-noise estimation for target detection. FIG. 15 shows how the prolate spheroidal windows can be used to form a detection/CFAR thresholding apparatus according to the invention.

The prolate spheroidal sequences form an orthogonal set of data windows 1503. For a set of N prolate spheroidal sequences, the $k^{th}$ sequence, $v_k(n;N,W)$, is defined as the real and normalized eigenvector of the N×N symmetric, positive definite matrix $$[A]_{m,n} = \frac{\sin 2\pi W(m-n)}{\pi(m-n)}, \quad 0 \leq m,n \leq N-1. \qquad (1)$$

associated with $K^{th}$ eigenvalue, $\lambda_k$, where $0 \leq n \leq N-1$, $0 \leq k \leq N-1$, and the eigenvalues are ordered in decreasing value. W is the passband of the filter and is known as the analysis bandwidth of the discrete prolate spheroidal sequences. It is an assigned constant such that $0<W<\frac{1}{2}$ and is typically on the order of 1/N, O(1/N). FIGS. 16a–e show the first five sequences, K=1 . . . 5, for time bandwidth product TW=4. The time bandwidth product trades off doppler resolution against detection performance. When TW is too high, resolution is lost and when TW is too low detection performance degrades. TW is picked to achieve a desired resolution and detection performance, e.g. 2.5 for an MPRF radar and 3.5 for a HPRF radar.

As shown in FIG. 15, on signal 1501 according to the invention clutter suppressed radar return data, as obtained for example through adaptive clutter suppression discussed previously herein, is applied to a plurality filters 1503 for orthogonal windows $W_1, W_2 \ldots W_R$ and a mean estimate window H, where $$H(n) = \frac{\sum\limits_{k-1}^{k} U_k(0) W_k(n)}{\sum\limits_{k-1}^{k} U_k^2(0)}$$

and $U_k(0)$ is the zero frequency term of the Fourier transform of $W_k$. The output signal for each orthogonal window is applied to a 2× zero fill operator 1505, whose output is then provided to a fast Fourier transform apparatus 1507. The fast Fourier transfer output $\hat{y}_1(f), \hat{y}_2(f) \ldots \hat{y}_k(f)$ corresponding to each orthogonal window $W_1, W_2 \ldots W_k$ is applied to one input of a summing device 1509. The negative zero frequency term $U_1(0), U_2(0) \ldots U_k(0)$ of the Fourier transform of each corresponding window $W_1, W_2 \ldots W_k$ is mixed with the output $\hat{\mu}(f)$ of the Fourier transform device for the mean estimated window H in mixer 1511. The output of the mixers is provided as another input to summing devices 1509. The output of summers 1509 is used to produce in-phase and quadrature signals $I^2$ & $Q^2$ which are summed as shown in devices 1513 and mixed in mixer 1515 with 1/k−1 for each orthogonal window $W_1, W_2 \ldots W_k$. The output of each mixer 1515 is routed to signal summing device 1517 to produce a signal on line 1519 representing the estimated return variance at frequency $f_0$. For the mean estimated window H, the sum of the in-phase and quadrature signals of $\hat{\mu}(f)$ is mixed with the summation from K−1 to K of $U^2_k(0)$ to arrive at an estimated return mean at frequency f on line 1521.

The arrangement in FIG. 15 is consistent with the discrete prolate spheroidal function $U_k(f; N,W,)$ which is defined by $$U_K(f;N,W) = \epsilon_k \sum_{n=0}^{N-1} v_k(n;N,W) \, i^{2\pi(n-\frac{n-1}{2})f} \qquad (2)$$

where $$\epsilon_k = \left\{ \begin{array}{ll} 1, & k \text{ even} \\ i, & k \text{ odd} \end{array} \right\}.$$

Figure 3A:
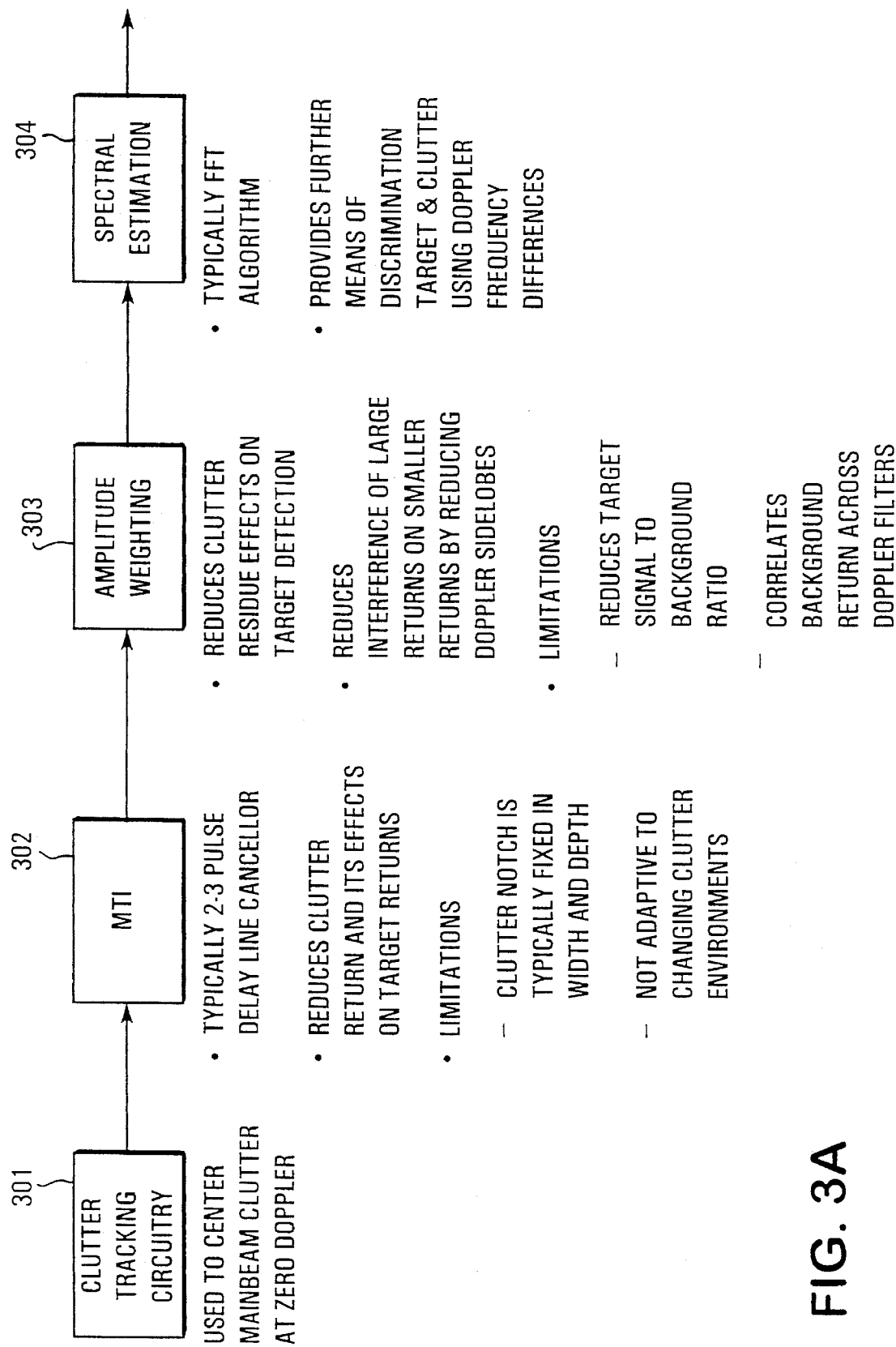
FIG. 3a shows a more detailed view of conventional clutter reduction techniques.
Figure 3B:
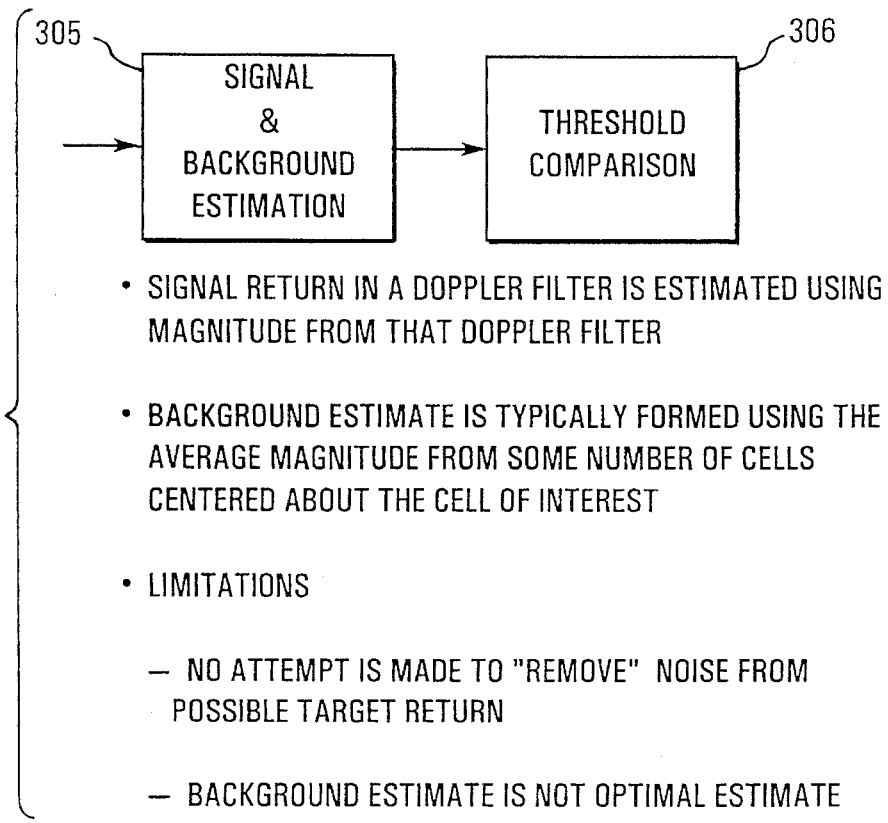
FIG. 3b illustrates elements used in conventional spectral estimation systems.
Figure 3C:
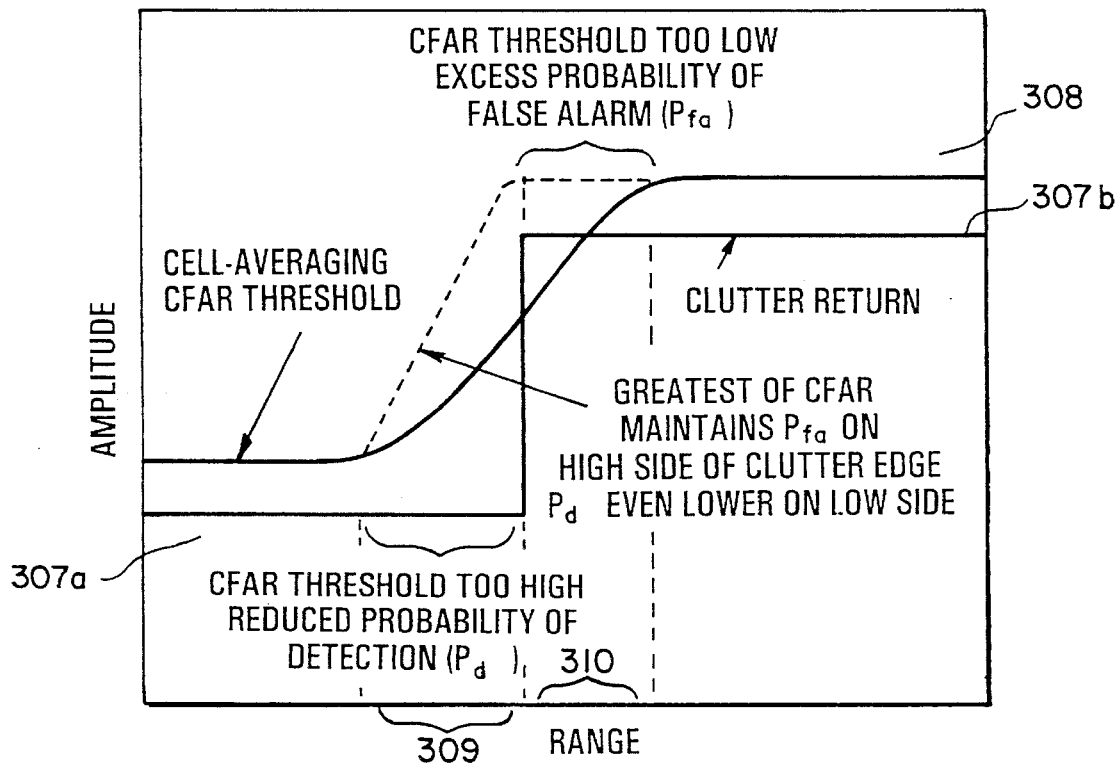
FIG. 3c illustrates clutter boundary conditions and limitations of conventional CFAR systems.
Figure 4:
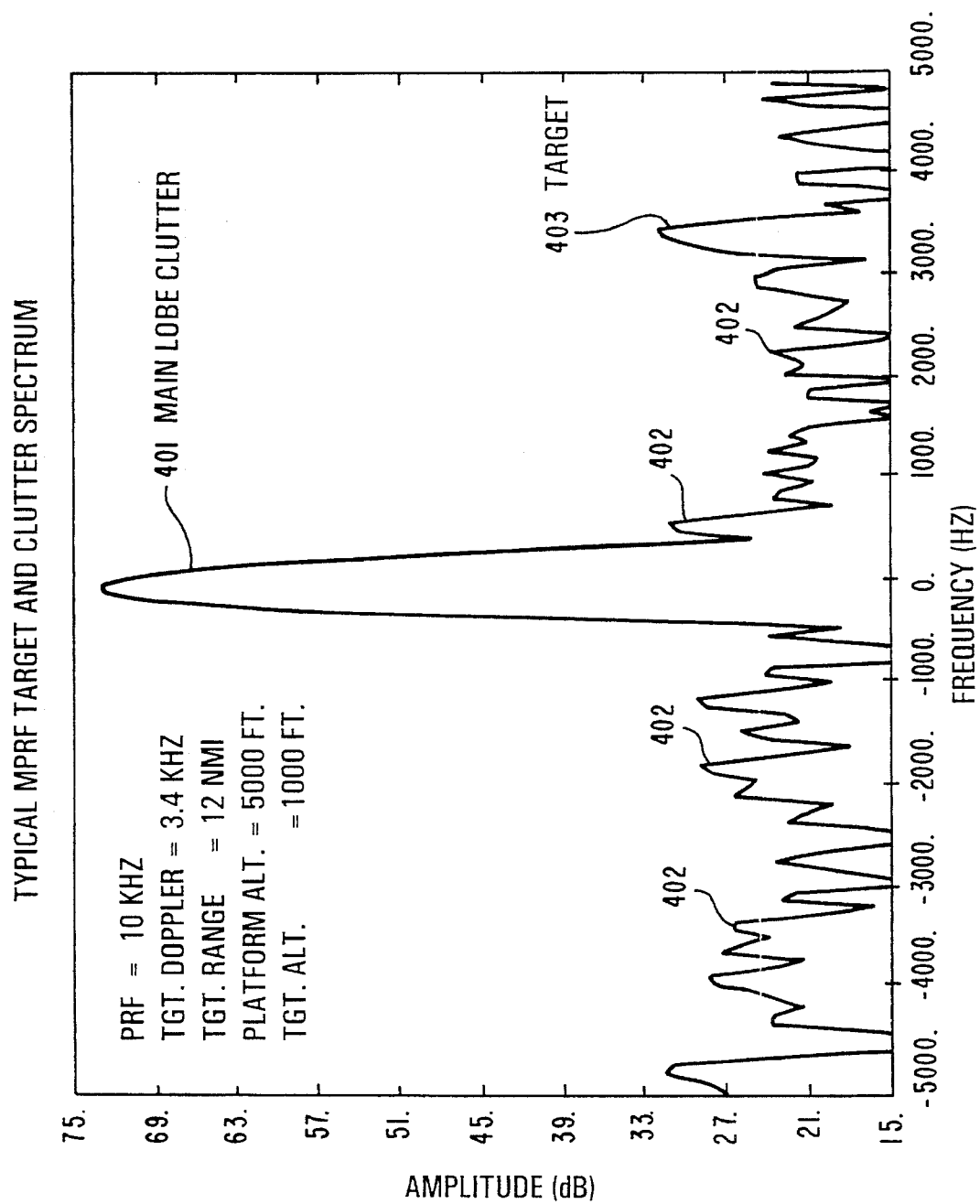
FIG. 4 illustrates a typical target and clutter spectrum modeled for a medium pulse repetition frequency (MPRF) radar.
Figure 5:
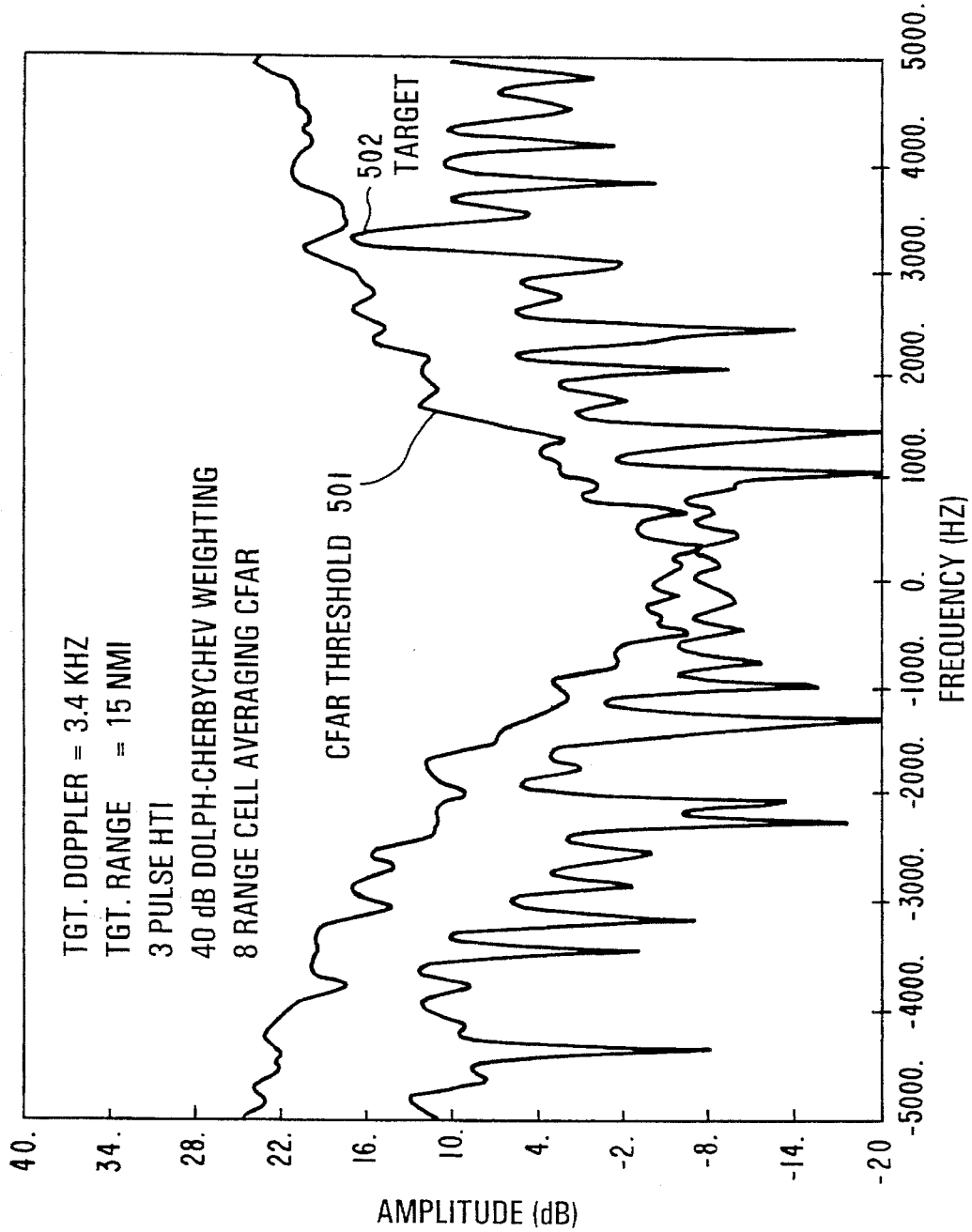
FIG. 5 illustrates a typical CFAR threshold and doppler target output over frequency employing conventional processing in a medium PRF radar.
Figure 6:
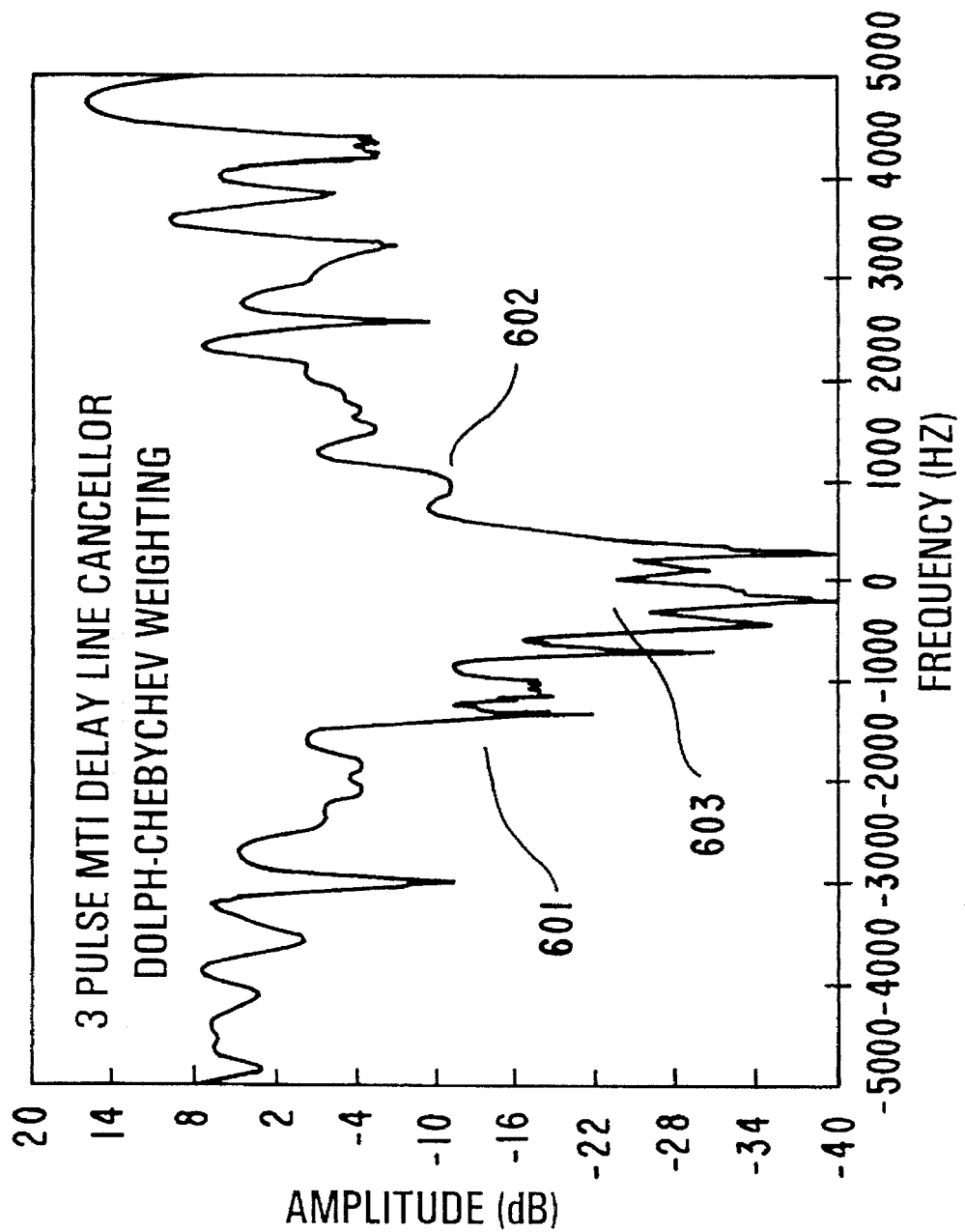
FIG. 6 illustrates a typical amplitude versus doppler frequency response for a three pulse conventional delay line canceler.
Figure 17A:
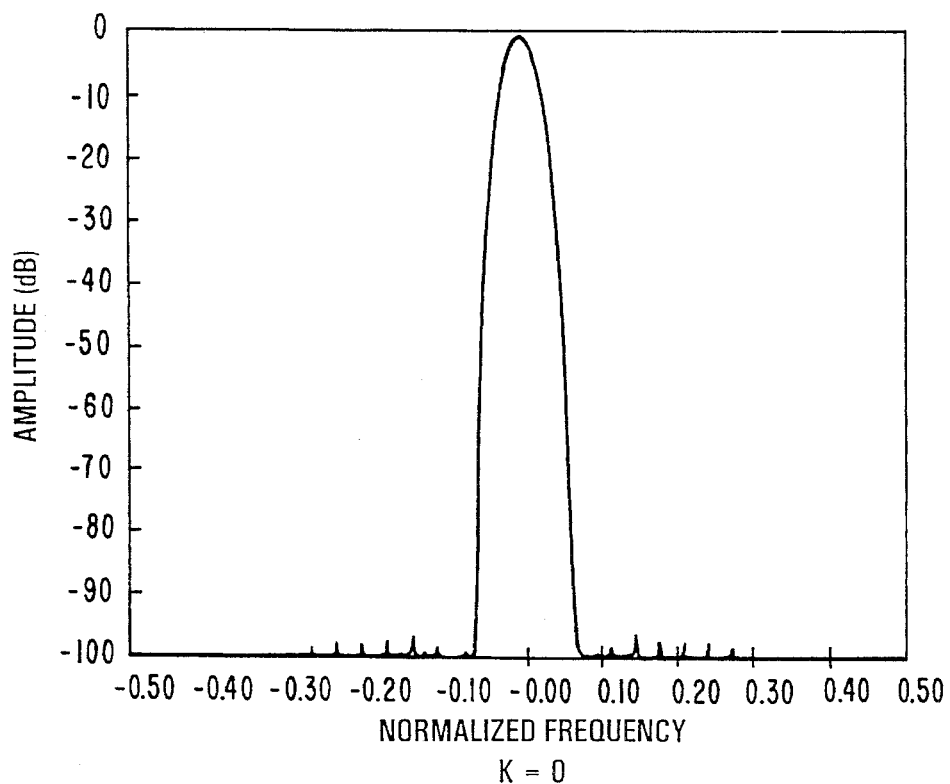
FIGS. 17a–f show the frequency response of prolate spheroidal functions.
Figure 17B:
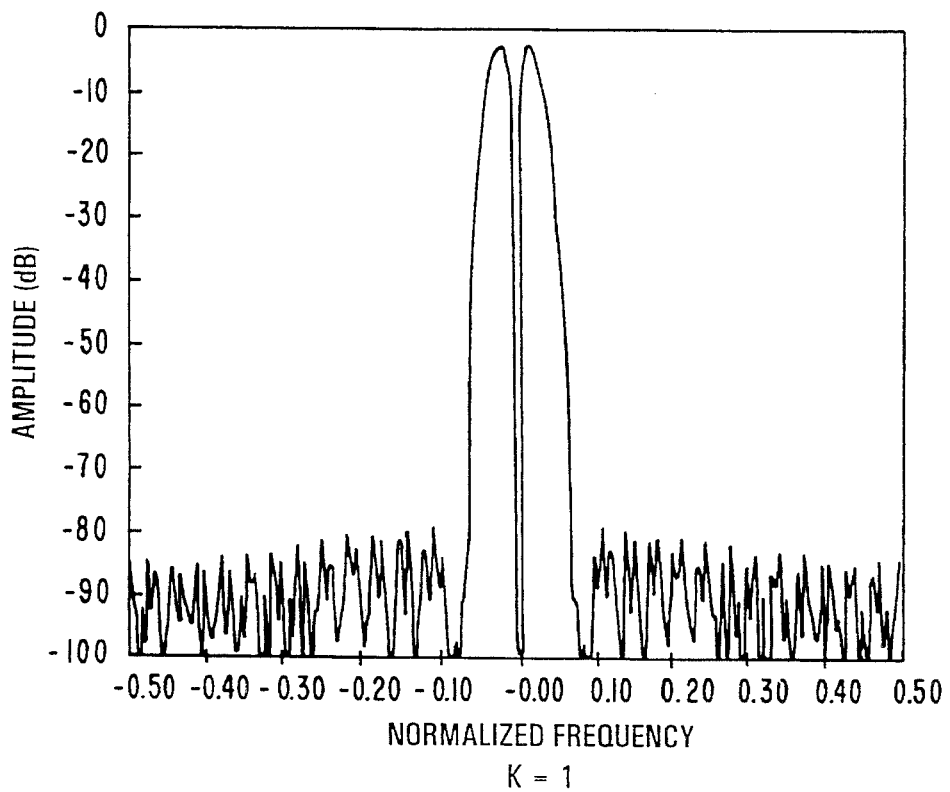
Figure 17C:
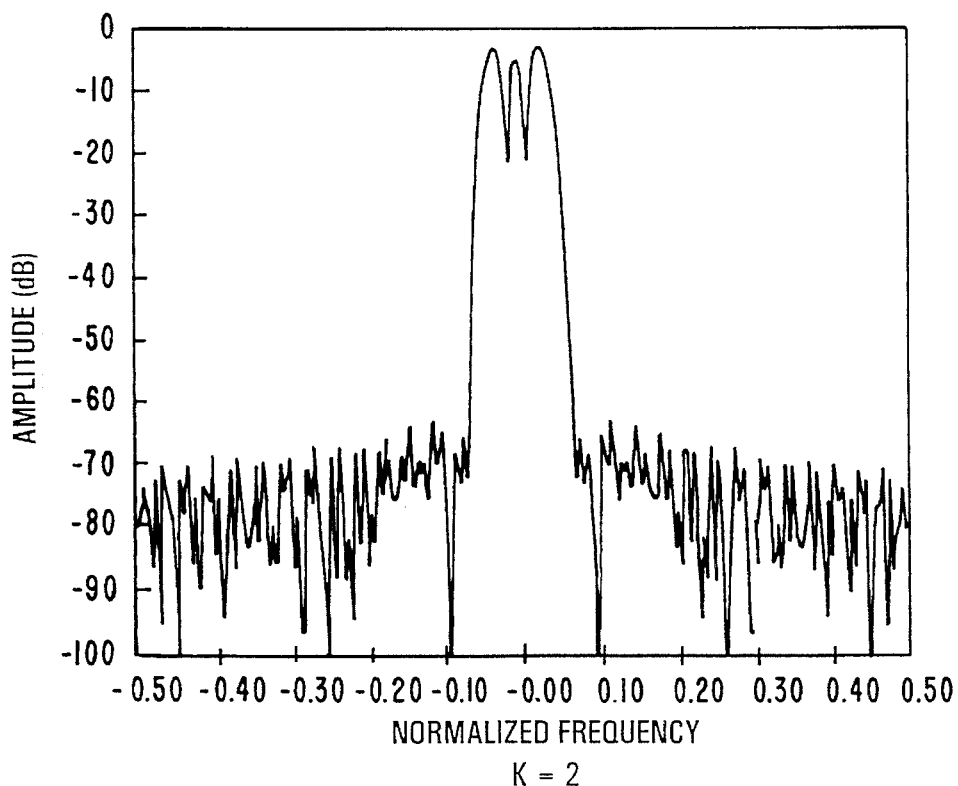
Figure 17D:
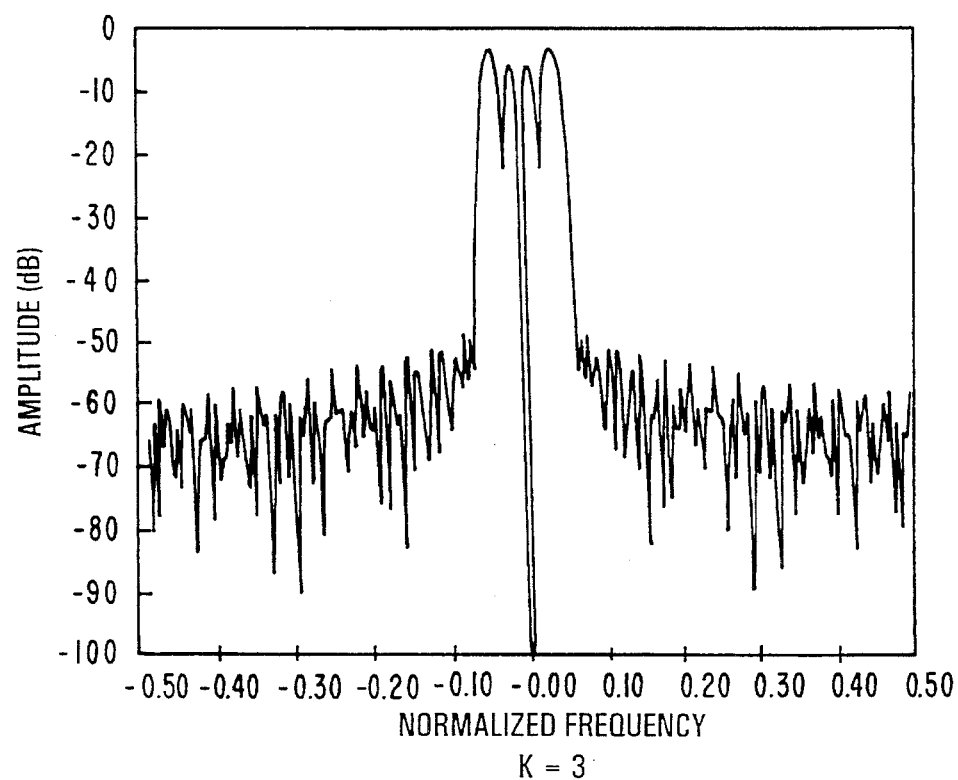
Figure 17E:
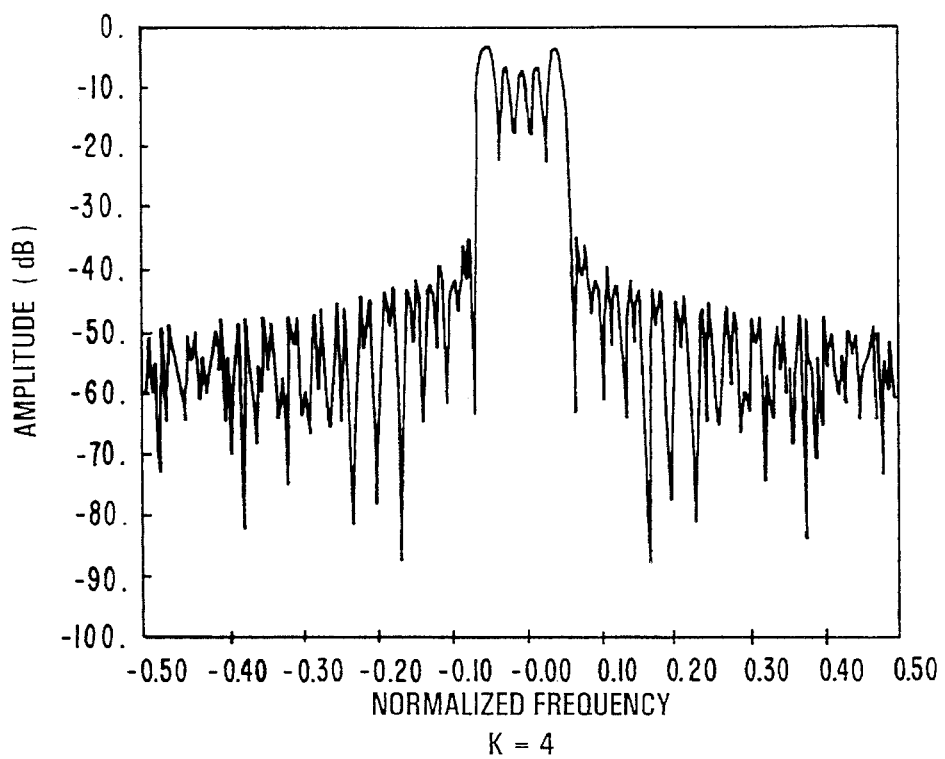
Figure 17F:
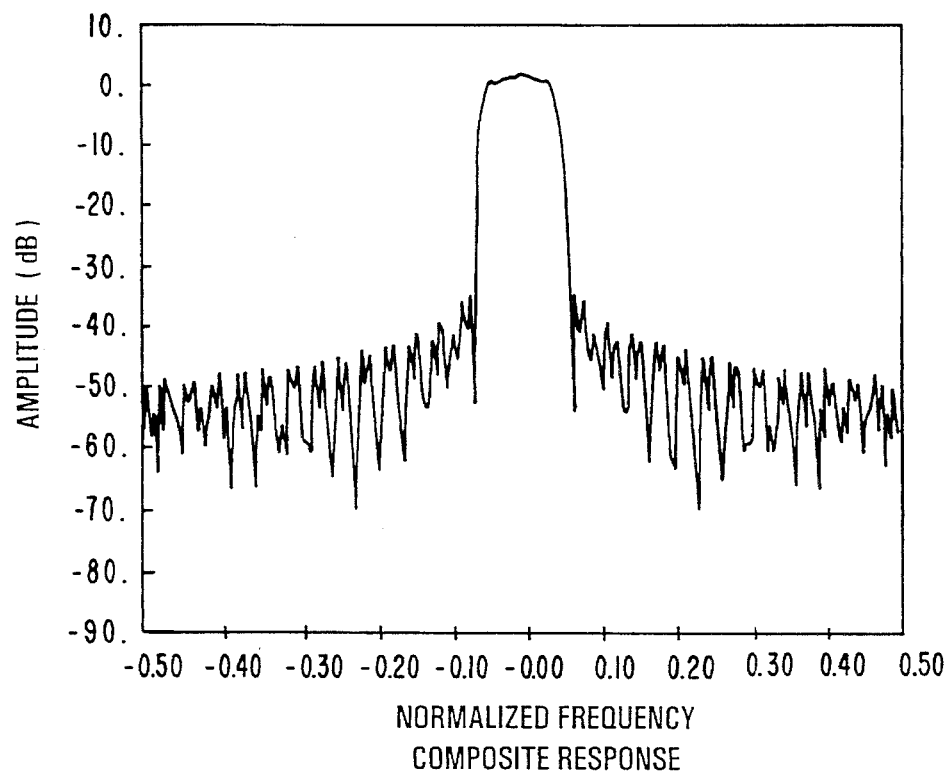

FIGS. 17a–3 shows the frequency response of the first five spheroidal functions and FIG. 17f shows the composite response of the first five prolate spheroidal function for TW=4.

The prolate spheroidal functions are real functions with the same even or odd parity as k. They are also doubly orthogonal in the following way; they are orthonormal over the entire sampling frequency $$\int_{-1/2}^{1/2} U_k(f) U_l(f) df = \delta_{kl}, \quad (3)$$

and orthogonal over the analysis bandwidth $$\int_{-w}^{w} U_k(f) U_l(f) df = \lambda_k \delta_{kl}, \quad (4)$$

The output data from the range cell of interest, x(n), after clutter suppression consists of N points of a Gaussian, stationary, locally white time series, where N is the number of pulses in a coherent dwell. This time series could be Fourier transformed using the prolate spheroidal sequences as windows. This will be done K times using K different windows, producing $y_k(f)$. The $y_k$'s are the eigencoefficients of y. These eigencoefficients can be expressed as $$y_k(f) = \sum_{n=0}^{N-1} x(n) \frac{v_k(n;N,W)}{\epsilon_k} \epsilon^{-2\pi(n-\frac{N-1}{2})f} \quad (5)$$

Using the stationary and whiteness properties of the clutter suppressed data and equation (3) it can be shown that:

$$E\{y_l(f)y_k(f)\} = C\delta_{jk} \quad (6)$$

where E { } is the expectation operator and C is a constant representing the background power spectral density. Thus, according to the invention, by creating multiple copies of the data in the range cell of interest and windowing each copy with a different prolate spheroidal sequence, the number of degrees of freedom in estimating the range call spectrum is increased, since there are now K orthogonal realizations of the spectrum as shown by equation (6). In effect the prolate spheroidal functions form a set of finite impulse response (FIR) minimum leakage filters which will produce a minimum variance, low bias estimate of the power in the band [−W,W].

The first 2TW eigenvalues are very close to unity. Thus, the first 2TW spheroidal sequences provide a set of orthonormal windows which concentrate most of their energy in the frequency band [−W, +W]. This provides a means for choosing the number of windows to use based on the choice of the bandwidth parameter, W. The doppler resolution, however, is inversely proportional to the analysis bandwidth; that is, the larger the choice of W, the less doppler resolution. Thus, a trade off is made between the desired number of degrees of freedom and the required doppler resolution. In general, choosing TW between two and four typically provides a good compromise.

As previously discussed, conventional thresholding techniques typically employ a version of the cell-averaging CFAR, which compares an estimate of signal power to an estimate of the background. The estimate of the signal is formed by taking the power output from the range/doppler cell under consideration. This output is actually a measure of the signal power, plus the noise power, plus a cross term caused by the interaction of the signal with the background noise. For a small signal return, a poor estimate of the signal power is produced and detection performance is degraded. Moreover, the background estimate is obtained by averaging the power of a number of range cells for the corresponding doppler cell, assuming a reasonably, homogeneous background. Targets present in nearby range doppler cells lead to background estimates which are too large, further degrading detection performance.

Using the multiple orthogonal representation of the doppler spectra, obtained through the use of the prolate spheroidal sequence data windows, it is possible, according to the invention, to obtain a more accurate estimate of the signal amplitude, as well as an estimate of the noise background, using only data from the range cell of interest.

As an example, assume that a target generates a signal in the range cell of interest at frequency $f_o$. The expected value of the $k_{th}$ eigencoefficient at frequency $f_o$ has a non-zero value $$E\{y_k(f_o)\} = \mu(f_o)U_k(0),$$

where $\mu(f_o)$ is the complex target amplitude at frequency $f_o$. An estimate of $\mu(f_o)$, denoted as $\hat{\mu}(f_o)$, can be formed, using standard regression techniques, so that $$\hat{\mu}(f_o) = \frac{\sum_{k=0}^{k-1} U_k(0) y_k(f_o)}{\sum_{k=0}^{k-1} U_k^2(0)}$$

As the eigencoefficients are combined linearly, $\hat{\mu}(f_o)$ can be expressed as $$\hat{\mu}(f_o) = \Im\{h(n) \times (n)\},$$

for n=0, N−1
where $\Im\{.\}$ denotes the Fourier transform and h is given by $$h(n) = \frac{\sum_{k=0}^{k-1} U_k(0) v_k(n;N,B)}{\sum_{k=0}^{k-1} U_k^2(0)}$$

This results in a better estimate of the signal amplitude, especially at low SNR, thereby improving detection performance.

Once an estimate of the mean has been formed, an estimate of the background $S(\eta_0)$, can be formed by $$S(f_o) = \sum_{k=0}^{K-1} |y_k(f_o) - \hat{\mu}(f_o) U_k(0)|^2$$

This estimate is distributed as a chi square variate with 2K−2 degrees of freedom $$(X_{2K-2}^2)$$

and, thus, permits estimation of the background using the information contained in a single range cell.

In summation, using the method according to the invention results in a reduced variance estimate of the mean signal value from each range/doppler cell, which is especially important at low SNR.

As stated above, the estimate derived for the signal power and the noise power are distributed as $$X_{2K-2}^2$$

The mean estimate squared, $$|\hat{\mu}(f)|^2$$

is the sum of two squared Gaussian variables and is, thus, distributed as $X_2^2$ Using these estimates to form an estimate of the SNR in the range/doppler cell under consideration results in an F variance-ratio test with 2 and 2K–2 degrees of freedom where $$F(f) = \frac{(K-1)|\hat{\mu}(f)|^2 \sum_{k=0}^{K-1} U_k^2(0)}{\sum_{k=0}^{K-1} |y_k(f) - \hat{\mu}(f) U_k(o)|^2}$$

The value of F can be calculated at each frequency and compared to a threshold which is set based on the desired probability of false alarms, $P_{fa}$ and the number of degrees of freedom in the numerator and the denominator.

Where clutter homogeneity is not a problem, for example, when clutter suppression has been applied or when the radar is looking upward, a multi-cell CFAR can be formed using the orthogonal representations of the doppler spectrum which results in increased detection performance without resulting in an increased false alarm rate. An arrangement for such a system was shown in FIG. 15. For a medium pulse repetition frequency system (MPRF) having range cell r and doppler cell f, $$|\hat{\mu}^{(x)}(f)|^2 \sum_{k=0}^{K-1} u_k^2(O) \stackrel{<}{>} \frac{C_1}{N+1} \sum_{\substack{n=r-N/2-1 \\ n+r-1, r+1}}^{r+N/2+1} \sum_{k=0}^{K-1} |y_k^{(n)}(f) - \hat{\mu}^{(n)}(f) U_k(O)|^2$$

where C, depends on the selected $P_{fa}$.

For a high pulse repetition frequency (HPRF) system with doppler cell f.

$$|\hat{\mu}(f)|^2 \sum_{k=0}^{K-1} U_k^2(O) \stackrel{<}{>} \frac{C_2}{N+1} \sum_{n=f-BN,2B}^{f+BN} \sum_{k=0}^{K-1} |Y_k(n) - \hat{\mu}(n) U_k(O)|^2$$

Figure 18B:
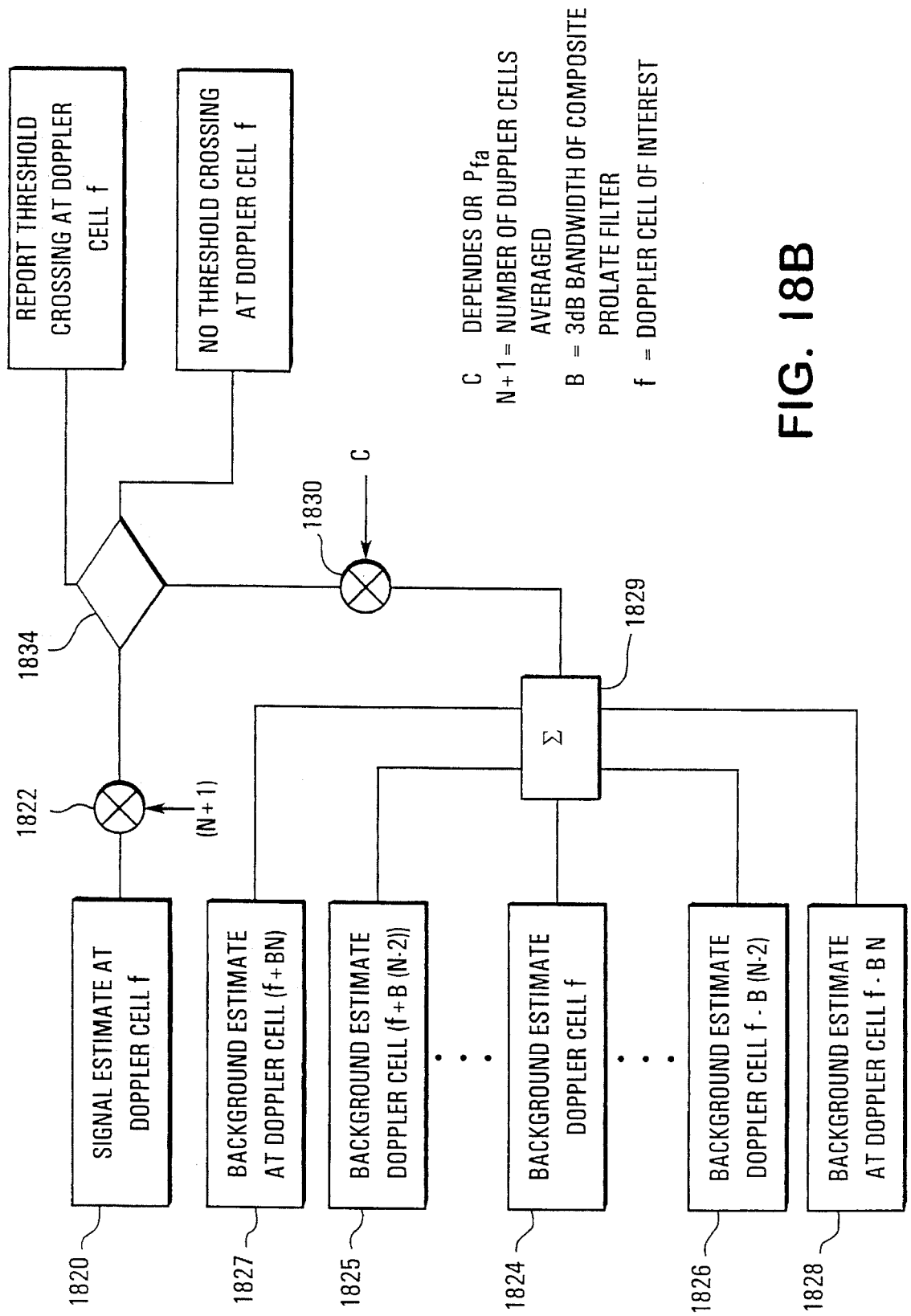

FIGS. 18a and 18b illustrate how such results are obtained for the MPRF and HPRF systems, respectively. In the MPRF case of FIG. 18a shows in blocks 1801 and 1803 that the signal estimate at range cell r and doppler cell f are multiplied by N+1 where N+1 is the number of range cells averaged. The background is estimated for doppler cell f in range cells r, r+2, r–2, r+N/2+1, and r–N/2+1, where r is the range cell of interest, as shown in blocks 1805–1809. The outputs of these blocks are summed as shown in block 1810 and multiplied in block 1811 by C, which depends on the probability of false alarms. The processed signal estimate output from block 1803 is compared with the background estimate output from block 1811, to indicate whether or not the threshold was crossed in decision block 1812.

FIG. 18b illustrates the high pulse repetition frequency case, where range ambiguities can exist. In this case, the signal estimate at doppler cell of interest, f, shown in block 1820 is multiplied in block 1822 by N+1, where N+1 is the number of doppler cells averaged. Background estimates of doppler cell f, f+BN, f–BN, f+B(N–2) and f–B(N–2) are found, as shown in blocks 1824 through 1828. These estimates are summed in block 1829 and multiplied by C, which depends on the probability of false alarms in block 1830. In block 1831, the processed signal estimate from block 1822 is compared with the background estimate from block 1830 to indicate whether or not a threshold has been exceeded.

Figure 19A:
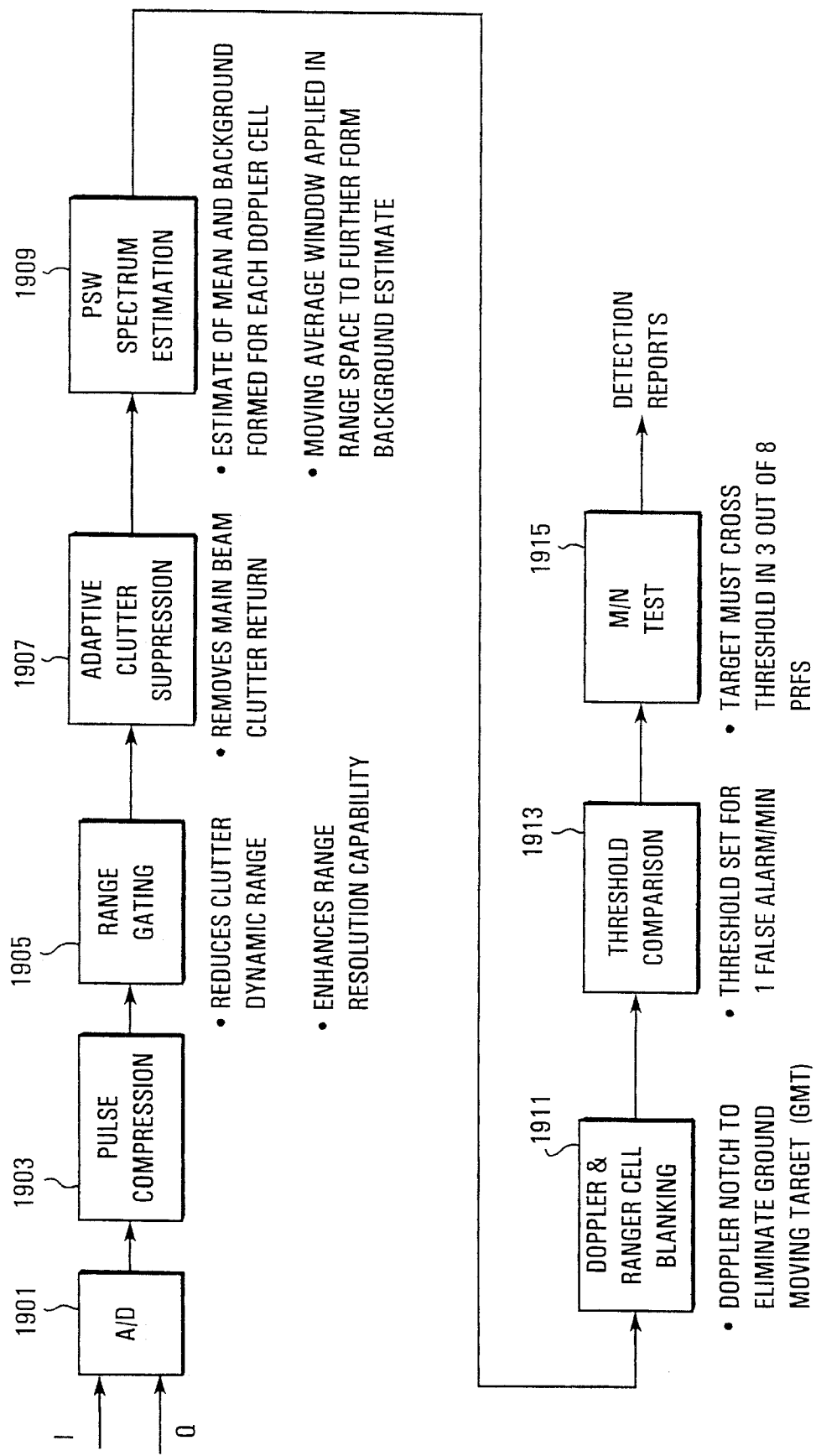
FIGS. 19a and 19b illustrate elements of a composite system for the MPRF and HPRF modes, respectively.
Figure 20B:
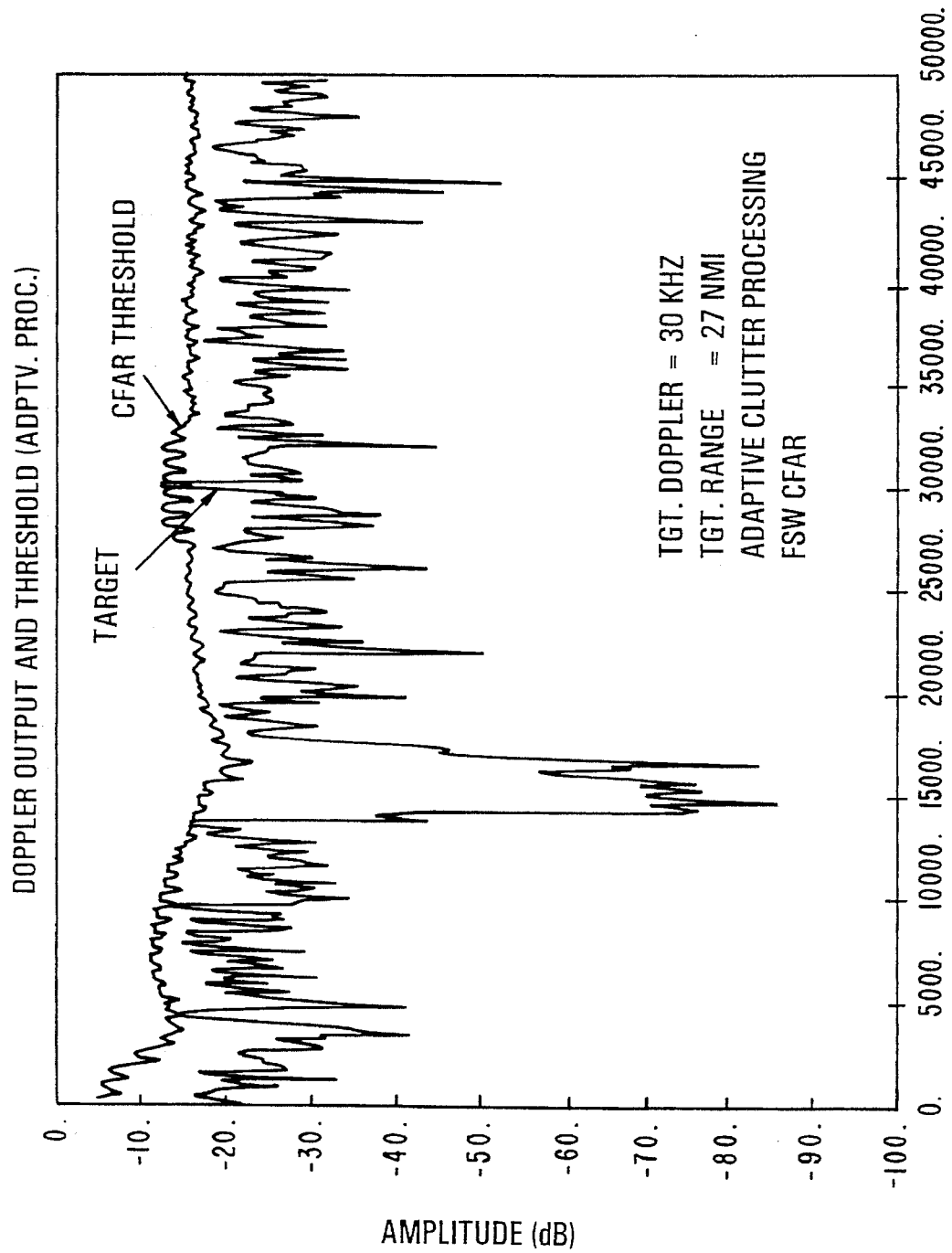

FIG. 19a is a block diagram showing signal processing according to the invention, according to the invention. I and Q channels are applied to an analog to digital converter 1901. A pulse compression circuit 1903 can then be used to provide a signal to range gating circuitry 1905. Circuitry to perform adaptive clutter suppression 1907, as previously described herein, is used to cancel the main beam clutter return. Prolate Spheroidal Window circuitry 1909 is then used to estimate the mean and background for each doppler cell. In addition, a moving average is window is applied in the range space to further form the background estimate. Doppler and range cell blanking circuitry 1911 can then be employed to provide a doppler notch to remove ground moving targets and a range notch to remove close in sidelobe discretes. Threshold comparison circuitry 1913 determines in a threshold for target detection has been exceeded and M/N test circuitry 1915 determines if the required number of PRFs had a target crossing the threshold to report a detection. FIG. 20a illustrates the doppler output and threshold for such a system and shows the major improvement in target detection in a system according to the invention, as compared to standard CFAR techniques.

Figure 19B:
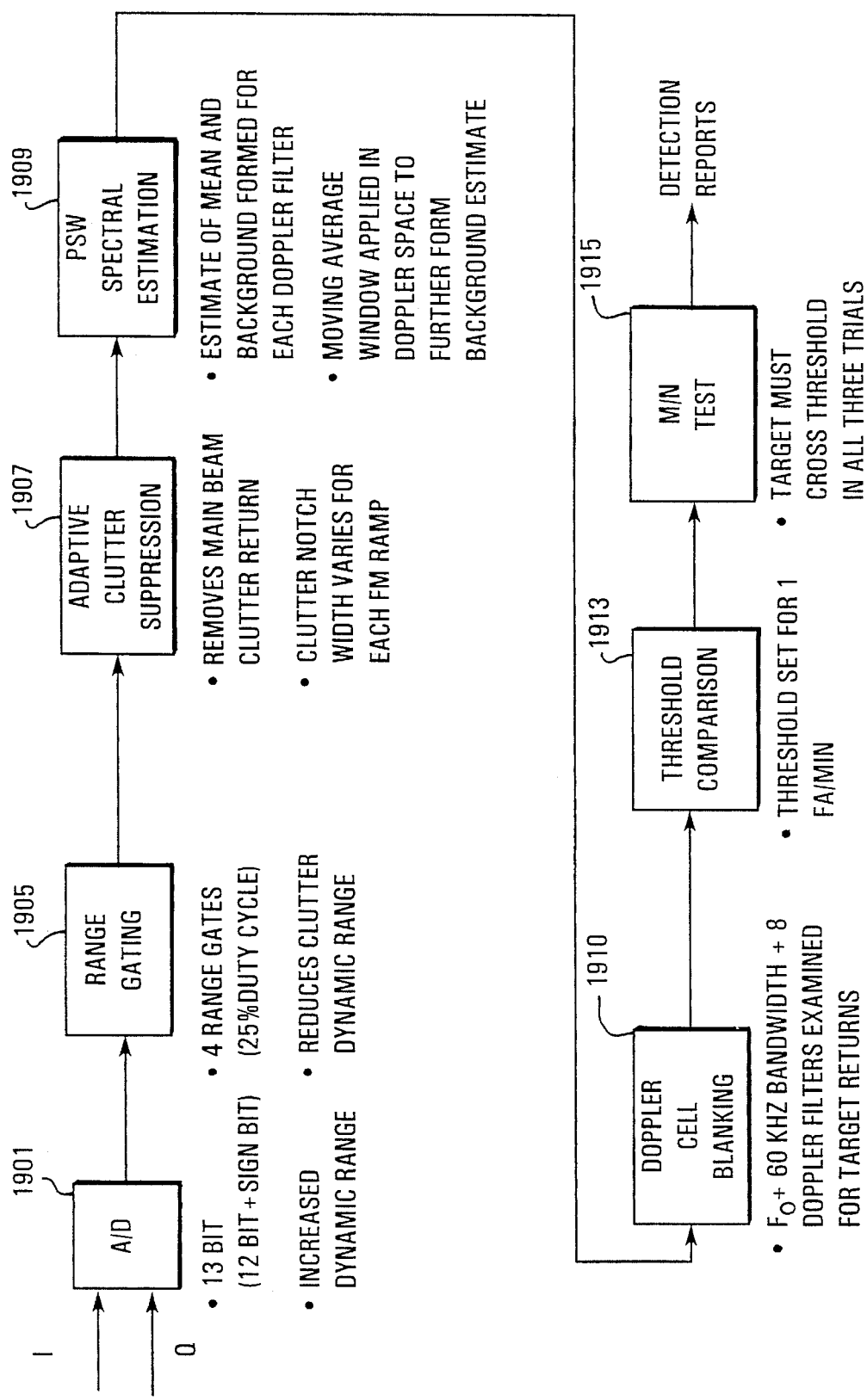

FIG. 19b shows the signal processing elements in a high pulse repetition embodiment of a system according to the invention. FIG. 19b is similar to FIG. 19a previously discussed with appropriate parametric differences shown.

It will be known to those of ordinary skill that other embodiments of the method and apparatus according to the invention described herein are possible and that the invention is not limited to the embodiments described herein. The invention is limited only by the claims and equivalents thereof.

What is claimed is:

1. A method of spectral estimation in a radar system, the method comprising the steps of:

receiving a radar signal;

applying an image of said radar signal to windows of different prolate spheroidal;

multiplying the products of each of said sequences with the radar signal;

computing Fourier transform of the product of each of said sequences with the said radar signal thereby providing a plurality of realizations of orthogonal eigenspectra and combining the said orthogonal eigenspectra into a minimum variance, low bias estimate of the mean power spectrum and an estimate of the variance of said spectrum for each frequency in the said spectrum to thereby provide a more accurate estimate of back ground noise and further improve detection performance.

* * * * *